(12) United States Patent
Liu et al.

(10) Patent No.: US 7,711,013 B2
(45) Date of Patent: May 4, 2010

(54) MODULAR FIBER-BASED CHIRPED PULSE AMPLIFICATION SYSTEM

(75) Inventors: Zhenlin Liu, Ann Arbor, MI (US); Gyu Choen Cho, Ann Arbor, MI (US); Xinhua Gu, Ann Arbor, MI (US); Otho E. Ulrich, Jr., Ann Arbor, MI (US); Donald J. Harter, Ann Arbor, MI (US)

(73) Assignee: IMRA America, Inc., Ann Arbor, MI (US)

( * ) Notice: Subject to any disclaimer, the term of this patent is extended or adjusted under 35 U.S.C. 154(b) by 502 days.

(21) Appl. No.: 10/813,163

(22) Filed: Mar. 31, 2004

(65) Prior Publication Data

US 2005/0226286 A1 Oct. 13, 2005

(51) Int. Cl.
*H01S 3/30* (2006.01)
(52) U.S. Cl. .................. 372/6; 372/9; 372/20; 372/25; 372/29.02; 372/32
(58) Field of Classification Search .......... 372/6, 372/9, 20, 25, 29.02, 32
See application file for complete search history.

(56) References Cited

U.S. PATENT DOCUMENTS

| | | | |
|---|---|---|---|
| 4,787,927 A | 11/1988 | Mears | |
| 5,400,350 A | 3/1995 | Galvanauskas | |
| 5,499,134 A | 3/1996 | Galvanauskas et al. | |
| 5,563,732 A | 10/1996 | Erdogan et al. | |
| 5,627,848 A | 5/1997 | Fermann | |
| 5,701,195 A * | 12/1997 | Chikama | 359/341.43 |
| 5,818,630 A | 10/1998 | Fermann et al. | |
| 5,854,865 A | 12/1998 | Goldberg | |
| 5,861,970 A | 1/1999 | Tatham | |
| 5,892,615 A | 4/1999 | Grubb et al. | |
| 6,034,975 A | 3/2000 | Harter | |
| 6,064,501 A | 5/2000 | Roberts et al. | |
| 6,067,187 A * | 5/2000 | Onaka et al. | 359/337.11 |
| 6,097,741 A | 8/2000 | Lin | |
| 6,104,526 A | 8/2000 | Kakui | |
| 6,151,338 A | 11/2000 | Grubb et al. | |
| 6,335,941 B1 | 1/2002 | Grubb et al. | |
| 6,340,806 B1 | 1/2002 | Smart et al. | |

(Continued)

FOREIGN PATENT DOCUMENTS

DE 195 12 160 A1 10/1995

(Continued)

OTHER PUBLICATIONS

'Pulse amplification at 1.5μm using a gated cascade of three erbium-doped fiber amplifiers', B. Desthieux, Appl. Phys. Lett., vol. 63, No. 5, pp. 586-588 (1993).

(Continued)

*Primary Examiner*—Wael Fahmy
*Assistant Examiner*—Hrayr A Sayadian
(74) *Attorney, Agent, or Firm*—Sughrue Mion, PLLC

(57) ABSTRACT

A modular ultrafast pulse laser system is constructed of individually pre-tested components manufactured as modules. The individual modules include an oscillator, pre-amplifier and power amplifier stages, a non-linear amplifier, and a stretcher and compressor. The individual modules can typically be connected by means of simple fiber splices.

9 Claims, 25 Drawing Sheets

FCPA block diagram (second embodiment)

U.S. PATENT DOCUMENTS

| | | | |
|---|---|---|---|
| 6,373,867 B1 * | 4/2002 | Lin et al. | 372/18 |
| 6,393,035 B1 | 5/2002 | Weingarten | |
| 6,433,306 B1 | 8/2002 | Grubb et al. | |
| 6,529,672 B1 * | 3/2003 | Blondel et al. | 385/140 |
| 6,570,892 B1 | 5/2003 | Lin et al. | |
| 6,813,429 B2 | 11/2004 | Price et al. | |
| 6,885,683 B1 | 4/2005 | Fermann et al. | |
| 7,088,756 B2 | 8/2006 | Fermann | |
| 7,190,705 B2 | 3/2007 | Fermann | |
| 2002/0105995 A1 * | 8/2002 | Govorkov et al. | 372/57 |
| 2002/0131164 A1 | 9/2002 | Palese | |
| 2003/0156605 A1 * | 8/2003 | Richardson et al. | 372/25 |
| 2004/0213302 A1 | 10/2004 | Fermann et al. | |
| 2004/0240037 A1 | 12/2004 | Harter | |
| 2004/0263949 A1 | 12/2004 | Gu | |
| 2004/0263950 A1 | 12/2004 | Fermann | |
| 2005/0018714 A1 | 1/2005 | Fermann et al. | |

FOREIGN PATENT DOCUMENTS

| | | |
|---|---|---|
| DE | 195 31 059 A1 | 2/1996 |
| DE | 197-17367 A1 | 10/1997 |
| DE | 19641577 A1 | 4/1998 |
| DE | 198-12203 A1 | 9/1998 |
| DE | 19956739 A1 | 7/2000 |
| DE | 101-24983 A1 | 3/2002 |
| DE | 10044404 A1 | 4/2002 |
| DE | 19911103 A1 | 6/2005 |
| DE | 19635919 B4 | 9/2005 |
| DE | 19802845 B4 | 11/2005 |
| JP | 2002-118315 A | 4/2002 |

OTHER PUBLICATIONS

Femtosecond Pulse Amplification at 250 kHz with a Ti:sapphire Regenerative Amplifier and Application to Continuum Generation: opt. Lett. 17, pp. 1009-1011(1992).

Rare-earth doped optical fibers for temperature sensing Quoi, K.W. pp. 847-852, Journal of Lightwave Technol. vol. 10, 1992.

Nonlinear Fiber Optics' Academic Press, Inc., Boston (1989), Chapter 4, Figure 4.3, p. 81.

U.S. Appl. No. 09/576,772, filed May 23, 2000, Martin E. Fermann.

U.S. Appl. No. 10/814,319, filed Mar. 31, 2004, Xinhua Gu et al.

Valentin, et al. Femtosecond Yb:YCOB laser pumped by narrow-stripe laser diode and passively modelocked using ion implanted saturable-absorber mirror, Electronic Letters, Sep. 14, 2000, vol. 36, No. 19, pp. 1621-1623.

* cited by examiner

FCPA block diagram

Optical Layout for Down counter module

Temporal performance of down counter

Spectrum from oscillator and
after first filter, isolator and attenuator module

—— Oscillator
—— With 1040 filter

Component illustration of
filter, isolator and attenuator module

Spectrum from nonlinear amplifier as a function of pump diode current and ASE spectral output at peak current ——— 1800mAASE
— - — 700mA
- - - - - 1400mA
——— 1800mA Component illustration of isolator -attenuator module between nonlinear amplifier and stretcher Spectrum of pulses with self-phase modulation propagating in a positive dispersion fiber

FREQUENCY SPECTRUM

Temporal profile of the pulse after stetcher

Spectral profile of the pulse after stetcher

Spectrum after power amplifier

Auto correlations of output pulse 5 ps range

Auto correlations of output pulse 50 ps range

Auto Correlations of Output Pulse Spectrum of Output

FCPA block diagram (second embodiment)

Spectrum from oscillator

Spectrum after filter module

Spectrum after preamplifier

Spectrum after power amplifier

Spectrum after compressor

Autocorrelation of compressed pulse $t_{ACl}$ = 488 fs
Pulse width : 345 fs
Assuming Gaussian shape Acousto-optic Deflector Illustrating Dispersive Characteristic of Induced Bragg Grating Rudimentary Two-pass Chirped-pulse Dispersion-compensated Acousto-optic Switch using Transmission Gratings Lens-enhanced Two-pass Chirped-pulse Dispersion-compensated Acousto-optic Switch using Transmission Gratings Lens-enhanced Four-pass Chirped-pulse Dispersion-compensated Acousto-optic Switch using a Reflection Grating

MODULAR FIBER-BASED CHIRPED PULSE AMPLIFICATION SYSTEM

TECHNICAL FIELD OF THE INVENTION

The present invention relates to an ultrafast pulse source for pulse energies in the submicrojoule to millijoule range. The present invention uses state-of-art technologies to build an all fiber based chirped pulse amplification laser system suitable for industrial applications.

BACKGROUND OF THE INVENTION

Fiber lasers and amplifiers are promising pulse source candidates for industrial applications, due to their unique simplicity of construction. Large core fiber amplifiers and specifically large core diffraction limited multi-mode amplifiers (as described by M. E. Fermann and D. Harter, 'Single-Mode Amplifiers and Compressors based on Multi-Mode Optical Fibers', U.S. Pat. No. 5,818,630) (incorporated by reference herein) enable the amplification of optical signals to levels where applications such as micro-machining and laser marking become possible. See A. Galvanauskas et al., U.S. patent application Ser. No. 09/317,221 (incorporated by reference herein). Since laser marking and micro-machining are dependent on the supply of high peak power pulses, it is advantageous to use such fiber amplifiers for the amplification of nanosecond regime (ns) pulses, as supplied, for example, by micro-chip lasers or general Q-switched sources. In conjunction with large-core fiber amplifiers, these ns pulse sources can be amplified to pulse energies in the hundreds of microjoules ($\mu J$). Such fiber amplifier systems can operate as direct replacements for Nd-based solid state lasers in any micro-machining or marking application.

The use of diffraction limited fiber multi-mode amplifiers allows a significant improvement in the power density to be delivered to a target compared to non-diffraction-limited multi-mode amplifiers as described for example in B. Desthieux, Appl. Phys. Lett., vol. 63, No. 5, pp. 586-588 (1993)). Note that in this early work the use of electrically driven semiconductor lasers for the generation of short optical seed pulses to high power amplifier chains, albeit with a final multi-mode power amplifier, was described.

The use of electrically driven semiconductor lasers for amplifier chains was later reiterated by Grubb et al., U.S. Pat. No. 6,151,338. A variety of complex fiber amplifier implementations for use in micro-machining applications again reiterating the use of electrically driven semiconductor seed lasers was recently also suggested in U.S. Pat. No. 6,433,306 to Grubb et al. In U.S. Pat. No. 5,892,615 to Grubb, the use of bent single-mode amplifier fibers has been suggested; the difficulty in making such single-mode amplifiers has also been a limitation in such high power fiber amplifier systems.

Advanced micro-machining or micro-structuring applications are enabled by amplification of ultrafast optical pulses in fiber media. Ultrafast optical pulses are generally characterized by a pulse width of less than 50 ps; conveniently, chirped pulse amplification is implemented to enable the amplification of such pulses to the $\mu J$-$mJ$ energy range. Generally, chirped pulse amplification systems use a near bandwidth-limited seed pulse source, which is temporally stretched (i.e. chirped) in a pulse stretcher before amplification in a power amplifier. After amplification, the pulses are recompressed to approximately the bandwidth limit using a pulse compressor. In Ser. No. 10/606,829 (incorporated by reference herein) the present inventors disclosed how to make such systems reliable and compact by utilizing nonlinear fiber grating stretchers with single pass large-core polarization maintaining amplifiers. In this invention, we disclose how to utilize telecomm components similar to those in manufacturing an ultrafast source for this laser as is disclosed in IMRA Ref No. IM-108 (incorporated by reference herein). In Ser. No. 10/608,233 (incorporated by reference herein) we disclose how to down count the rep-rate utilizing lithium niobate modulators which are telecomm components. In this invention we will disclose practical problems and solutions utilizing AOM for these down counters. AOM for fiber amplifier systems were first disclosed in U.S. Pat. No. 5,400,350 (incorporated by reference herein). In this invention we disclose how to solve or utilize the problem of spatial dispersion caused by the AOM.

Recently, modular, widely tunable fiber chirped pulse amplification systems were described by M. E. Fermann et al., 'Modular, High Energy Widely Tunable Ultrafast Fiber Source', U.S. patent application Ser. No. 09/576,772, (incorporated by reference herein) which increase the spectral width of ultrashort pulses in amplifiers by parabolic pulse amplification. These pulses can then be recompressed to pulse widths shorter than the input pulses. In Ser. No. 10/437,057 (incorporated by reference herein) use of self-phase modulation in positive dispersion amplifiers with sources that have variable rep rates was described. Here we disclose how to utilize such systems in industrial FCPA systems. This leads to a careful match of the spectral components of the amplifiers and the oscillators as well as careful control to maintain output pulse properties. More recently parabolic amplification has been applied to FCPA systems in 2003/0156605.

Stabilization of gain against environmental variation is a key task for an industrial laser application. Most rare earth-doped fiber has a narrow absorption band where the wall-plug efficiency is high. In Er-doped fiber, usually a wavelength-locked 980 nm pump diode is used in order to avoid variation of the emission spectrum of the diode over temperature. (See, U.S. Pat. Nos. 5,563,732 and 6,335,944 B1, both incorporated by reference herein). The wavelength locking can be provided by partial feedback with a fiber Bragg grating. The temperature sensitivity of a silica based fiber Bragg grating is typically in the range of 10 pm/C, whereas a GaAs-based quantum well chip has sensitivity in the range of 0.3-0.5 nm/C. On the other hand, this concept is available if the absorption spectrum of the gain fiber is not widely varied over the required temperature range. Also this concept is appropriate for Er-doped fiber where the absorption spectrum is relatively stable over the industrial temperature range of 10-40 C. The pump wavelength and gain over temperature are passively set at a predetermined value.

These methods, however, have been only demonstrated for a pump diode with a single mode fiber coupler with the fiber Bragg grating written in a single mode fiber. Thus far, no embodiment of these methods has been described for high power diode bundles with a multimode fiber coupler. Difficulties lie in coupling cavities in stable coherence collapse regime with a multimode fiber pigtail and homogeneous Bragg grating fabrication in multimode fiber.

When effective wavelength locking is not available, an active regulation of the pump diode current or temperature is an alternative, by monitoring the pump wavelength. However, this solution faces a limit if the temperature-dependent variation of the gain fiber absorption is large, so that wavelength stabilization for the pump chip alone does not guarantee the required stable operation of the laser. An exact monitoring of the absorption spectrum of the gain fiber over temperature is required.

Thus the conventional concept described above is not applicable for stabilization of the gain fiber for stable output over a wide temperature range where: 1) wavelength locking using a device, e.g., a fiber Bragg grating, with a low temperature sensitivity in comparison with the pump device is not available, 2) the absorption spectrum of a gain medium has a large variation over temperature, so that a passively set wavelength does not provide the required stability of gain, 3) temperature sensing of the gain fiber is necessary for accurate gain stabilization.

The prior art device for extracting one or more pulses from a series of pulses produced by a high repetition-rate laser is an acousto-optic deflector. A system that utilizes such a pulse selector for micromachining is given in U.S. Pat. No. 6,340,806. This means works well with lasers that have very limited spectral bandwidths; typically lasers with pulse duration in excess of about a nanosecond. However, the wide spectral bandwidth of the output of an ultrashort-pulse laser results in the spatial separation of the various wavelength components of such a pulse when subjected to the dispersive Bragg grating of an acousto-optic deflector. This is a well known effect, and cavity dumping pulses from ultrafast oscillators or from regenerative amplifiers as shown in (T. B. Norris "Femtosecond Pulse Amplification at 250 kHz with a Ti:sapphire Regenerative Amplifier and Application to Continuum Generation: Opt. Lett. 17, pp. 1009-1011 (1992)) are performed by double passing the AOM with a curved mirror that brings all the components back to the same point. Thus the dispersion becomes corrected. This means could be used here, however the system would not be compact. The instant invention compensates for the dispersion, with the additional advantage of incorporating means to compress the chirped pulses to shorter duration.

SUMMARY OF THE INVENTION

The following topics are covered in this application.
1) Functional segmentation of opto-mechanical components into modular devices to produce manufacturable industrial laser systems with Telcordia-grade quality and reliability.
2) Polarization fidelity within and between modules
3) Provision for tap units for test, monitoring or feedback
4) Spectral matching of oscillator to amplifier
5) Selection of the length of an amplifier to cut ASE at the lasing wavelength
6) Active stabilization of the optical performance of gain fiber in a laser or amplifier. The stabilization is realized by actively adjusting the pump source wavelength by changing the source temperature in order to match pump wavelength with the absorption spectrum of the gain medium. The temperature dependent spectrum in the gain fiber is cloned in the same type of fiber, and thus used as a monitor. Accurate control of the gain performance over a wide range of operating temperatures is possible implementing this method.
7) Extraction of one or more chirped pulses from a series of such pulses using an acousto-optic deflector, and compensation for detrimental effects on the spatial characteristics of the extracted chirped pulse, caused by dispersion in that deflector.

The invention thus relates to the technologies necessary to overcome the above problems and limitations of the prior art, to build a fiber-based chirped pulse amplification laser system suitable for industrial applications, in a modular and compact laser design with all modules replaceable. The modules are designed and manufactured to telecom standards and quality.

Environmentally stable laser design is crucial for industrial application. An industrial laser system can be, for example, characterized by an output power variation below 0.5 dB over an environmental temperature range from 0 to 50 degrees Celsius, and by compliance with the vibration, thermal shock, high temperature storage and thermal cycling test criteria in Telcordia GR468-CORE and GR-1221-CORE. This target can be achieved by functional segmentation of the components and packaging the modular device with Telcordia-qualified packaging technology. Before the modules are assembled into a system, they are tested and assembled separately.

Included in the modules are tap units that allow taking out signals along the propagation path in an integrated design. This is necessary for the optimization of each module as it is assembled, and important in the spectral matching along the chain of modules.

Polarization units are provided to prevent the buildup of side-pulses from orthogonal polarization light.

The acousto-optical down counter module can be designed to operate as a bandwidth filter. For further modulation of the signal an additional pulse extractor can be included near the end of the output. This unit suffers from dispersion due to the large bandwidth of the pulse. The compressor can be used to correct for this dispersion as disclosed hereafter.

The invention also relates to a means to extract one or more chirped pulses from a series of such pulses using an acousto-optic deflector, and to compensate for the detrimental effects on the spatial characteristics of the extracted chirped pulse caused by dispersion in that deflector. An important aspect of this system is to manage the spectrum of the pulse in the system while maintaining the ability to correct for dispersion and compress the pulse back to the femtosecond regime. Two principal embodiments will be described. The first is the case where the spectral content of the seed pulse is small. In this case a nonlinear amplifier may be employed for the generation of additional spectrum while spectral filtering is employed to obtain a compressible pulse. The second case is where the spectrum from the source is larger than necessary. Nonlinear affects can be limited in the amplifier chain in this case, while spectral filtering is again employed to obtain a compressible pulse. An additional attribute that is necessary for many applications is the reduction of the ASE at the output. Specific amplifier designs are used to cut the ASE at the output wavelength. The compressor can be used as an optical spectral filter to this end.

Once gain performance is attained, a method for active stabilization of the optical performance of the gain fiber in a laser or amplifier is disclosed to maintain this performance. The present invention stabilizes the temperature dependent absorption of a gain fiber over a wide environmental temperature variation by an active feedback loop. A piece of fiber, optically identical with the gain fiber itself, is used as a spectral filter for monitoring the emission spectrum of the pump diode. The absorption spectrum of the filter fiber follows that of the gain fiber if both fibers are packaged so that the fibers are in proximity to each other. The transmission of the pump light through the filter fiber clones exactly the absorption characteristics of the gain fiber at a given package temperature. The temperature of the pump diode is controlled by a feedback loop such that the transmission through the filter fiber is maintained at the minimum. Importantly, the filter fiber functions as an active temperature sensor of the gain fiber. Precise spectral control of the gain at any fiber or package temperature can thus be realized.

As mentioned above, an important field of use for this system is in micromachining. An additional feature needed for this application field is the capability to start and stop the pulse stream while moving the targeted material in place. One method to do this is to control the down counter. However, this leads to problems with gain stabilization in the amplifier and excessive ASE on target. These problems have been addressed in A8699 "Method and Apparatus for Controlling and Protecting Pulsed High Power Fiber Amplifier Systems" (filed concurrently herewith and incorporated by reference herein). However, another means to stop the pulse stream is to utilize an optical switch at the output.

The invention extracts one or more chirped pulses from a series of such pulses using an acousto-optic deflector, and compensates for the detrimental effects on the spatial characteristics of the extracted chirped pulse caused by dispersion in that deflector. The instant invention has the additional advantage that the means to compensate for dispersion in the acousto-optic deflector can be used to compress the duration of the chirped pulse. This is accomplished by placing the AOM in proximity to a grating compressor.

FIG. IC shows an example of a side-pumped fiber amplifier, which may operate as a non-linear amplifier or a power amplifier.

Figure 2:
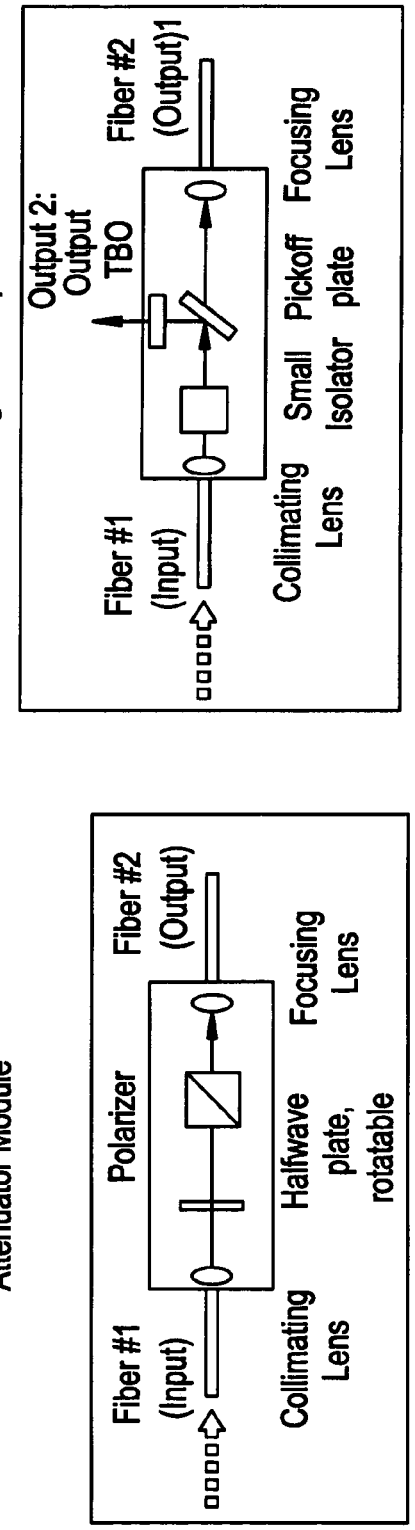
Figure 2:
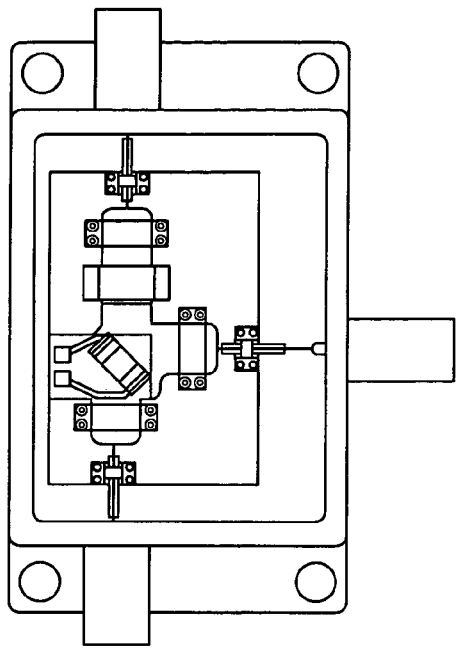
Figure 2:
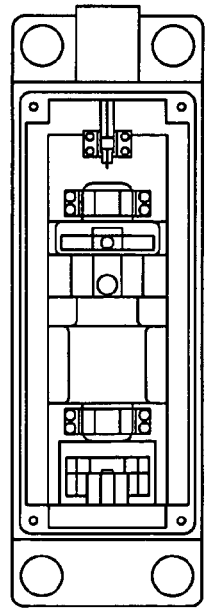

FIG. 2 illustrates a package of a telecomm-type attenuator and tap-point modules.

Figure 3:
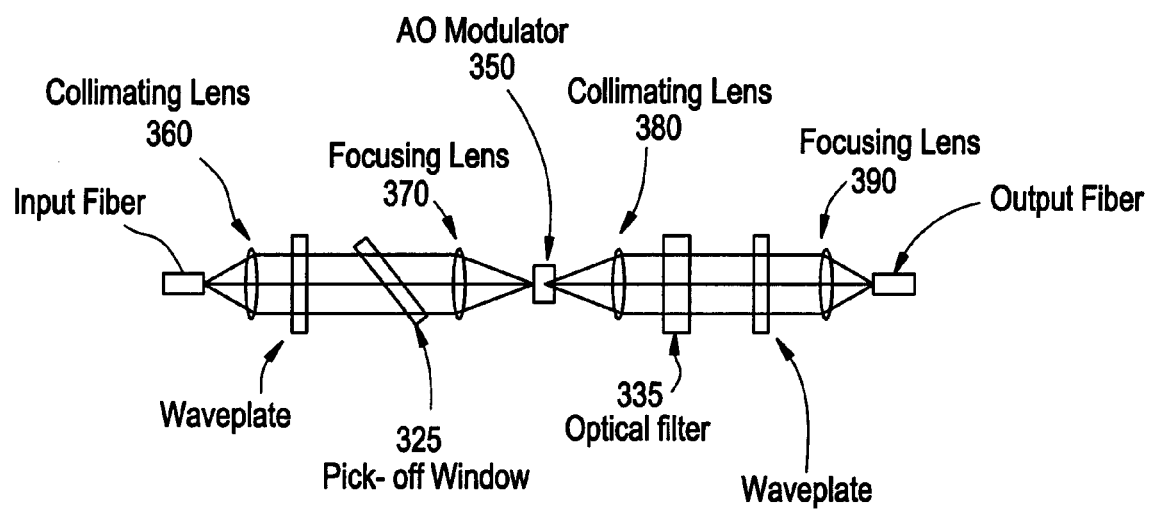

FIG. 3 shows the optical layout for a down-counter module. This shows the ability to add additional components in the collimated beams before and after the AOM.

Figure 4:
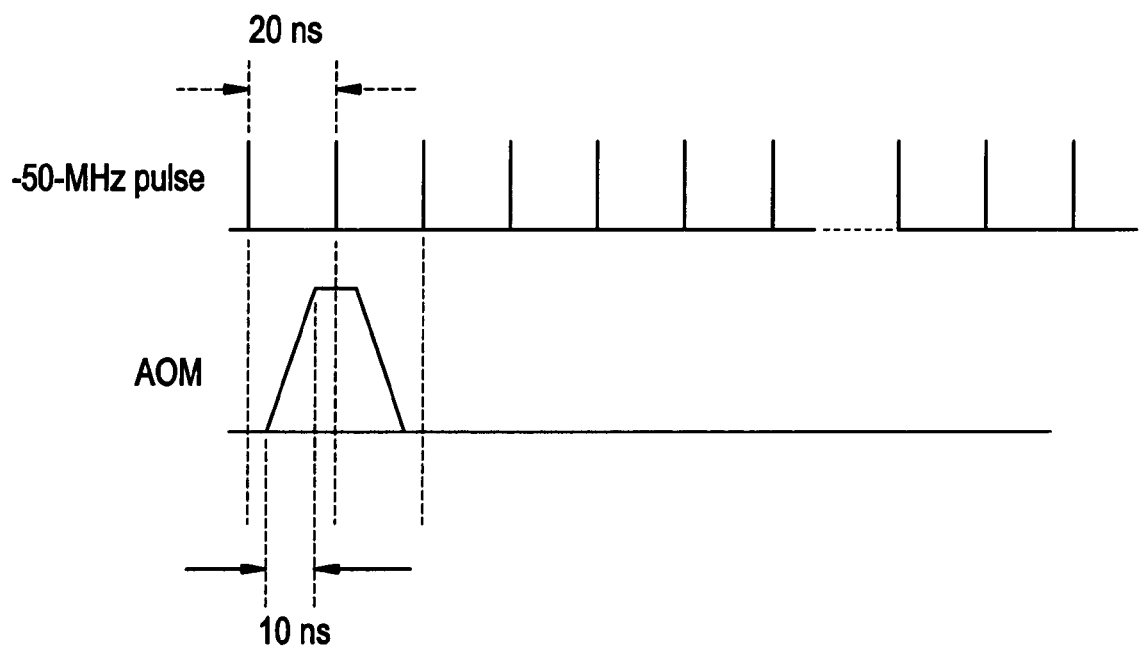

FIG. 4 shows the temporal performance of the down counter by illustrating the ~10 ns window where a single pulse is selected from the train of pulses from the femtosecond oscillator.

Figure 1:
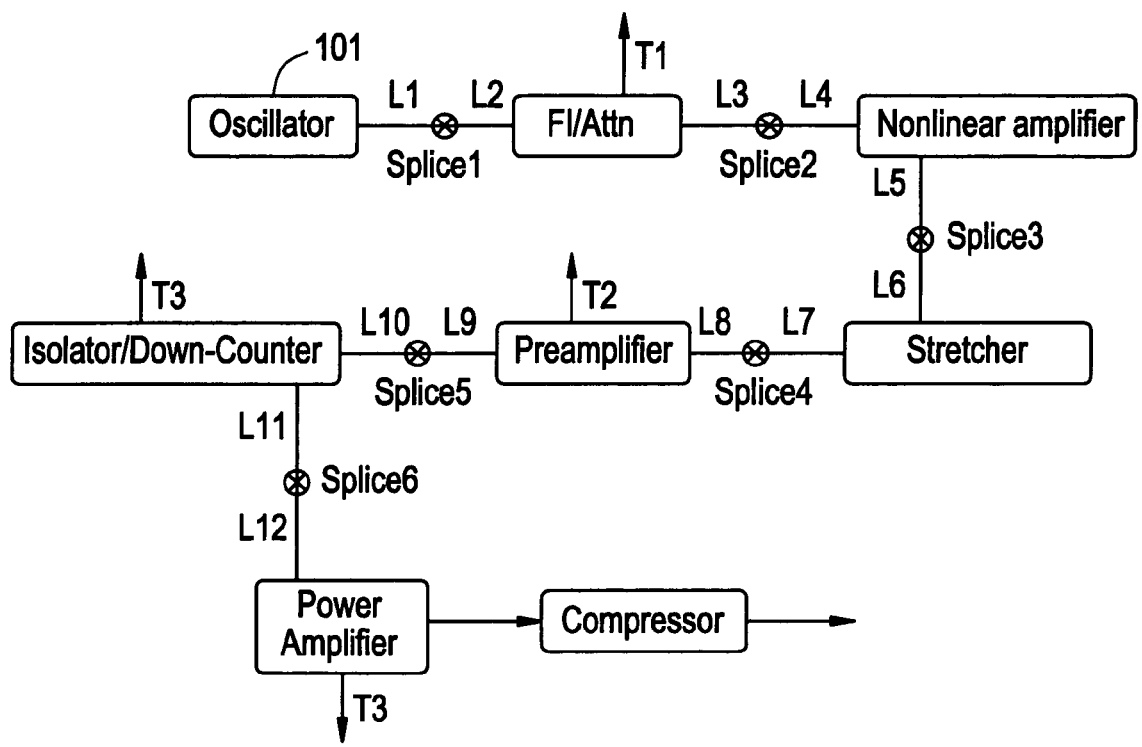
FIG. 1 illustrates a FCPA with nonlinear amplifier and 8 modules: oscillator, FI/attenuator, nonlinear amplifier, stretcher, preamplifier, down-counter with isolator, power-amplifier and compressor.

FIG. 5(*a*) shows the spectrum from the oscillator and after first filter, isolator and attenuator module as illustrated in the FCPA block diagram in FIG. 1.

FIG. 5(*b*) is a component illustration of the filter, isolator and attenuator module.

FIG. 6(*a*) shows the spectrum from the nonlinear amplifier as a function of pump diode current and ASE spectral output at peak current.

FIG. 6(*b*) is a component illustration of the isolator—attenuator module between nonlinear amplifier and stretcher.

Figure 7:
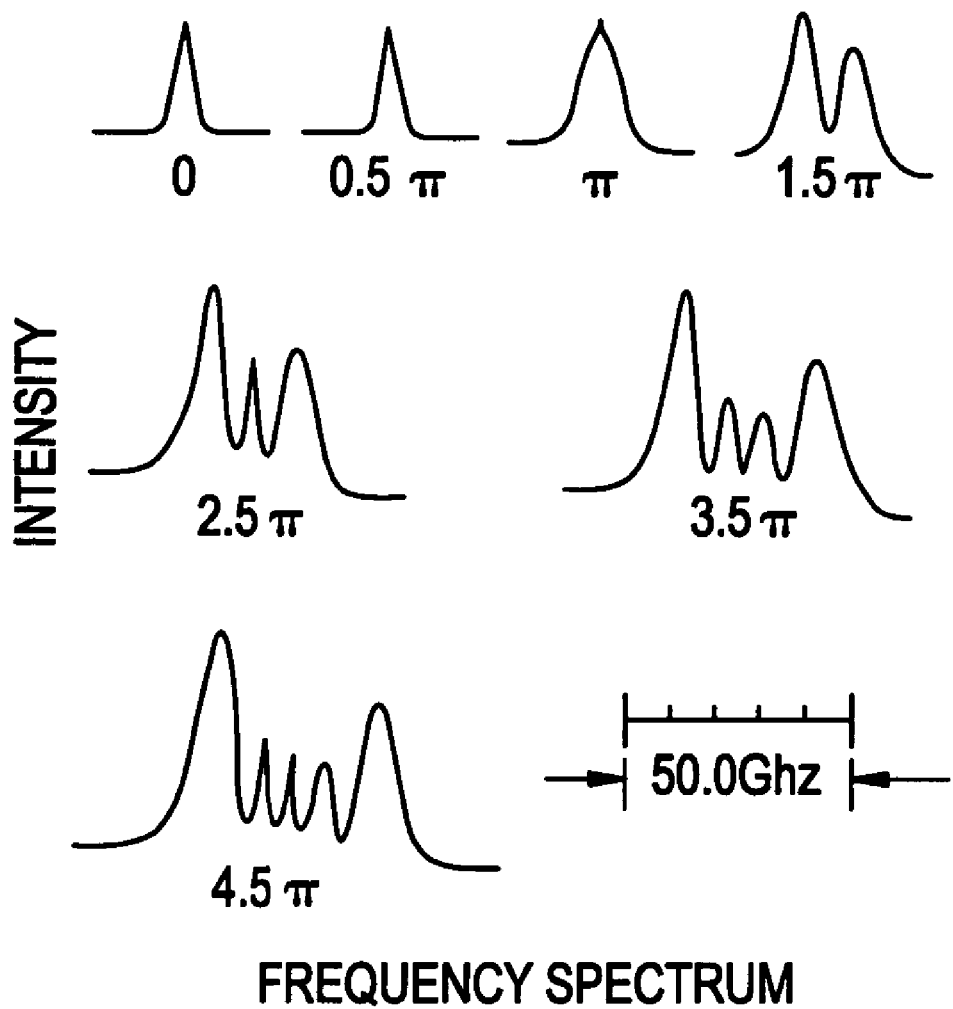

FIG. 7 shows the spectrum of pulses with self-phase modulation propagating in a positive dispersion fiber.

Figure 8A:
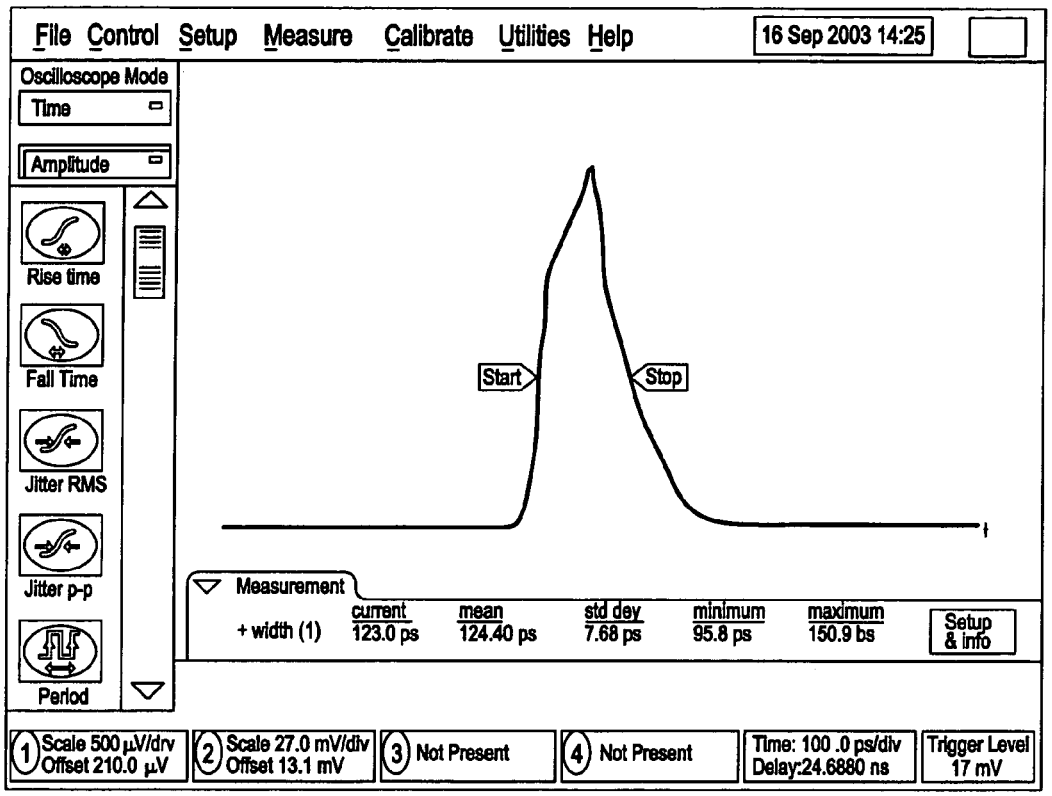
Figure 8B:
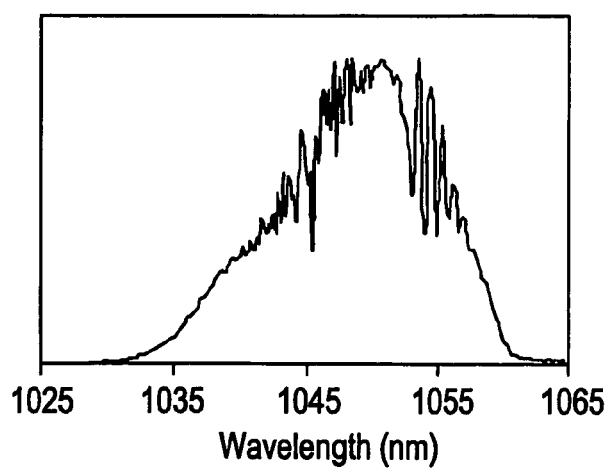

FIGS. 8A and 8B are temporal and spectral profiles of the pulse after the stretcher as illustrated in the FCPA block diagram in FIG. 1.

Figure 9:
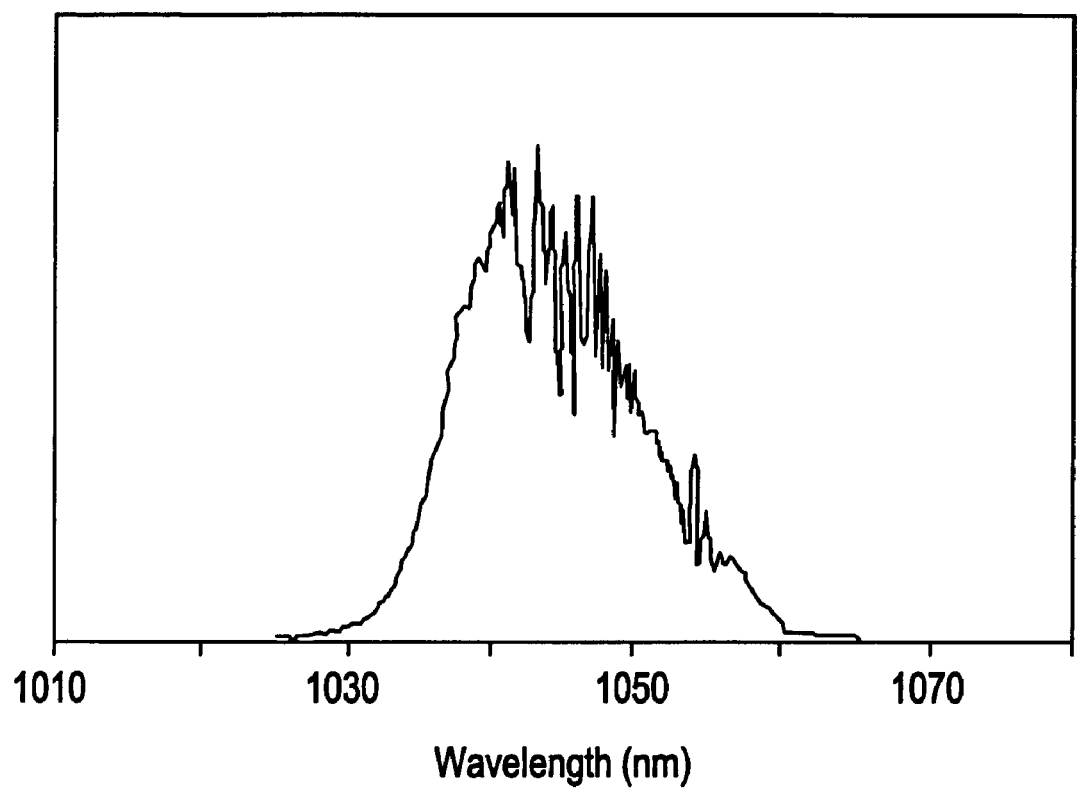

FIG. 9 shows the spectrum after the power amplifier as illustrated in the FCPA block diagram in FIG. 1.

Figure 10A:
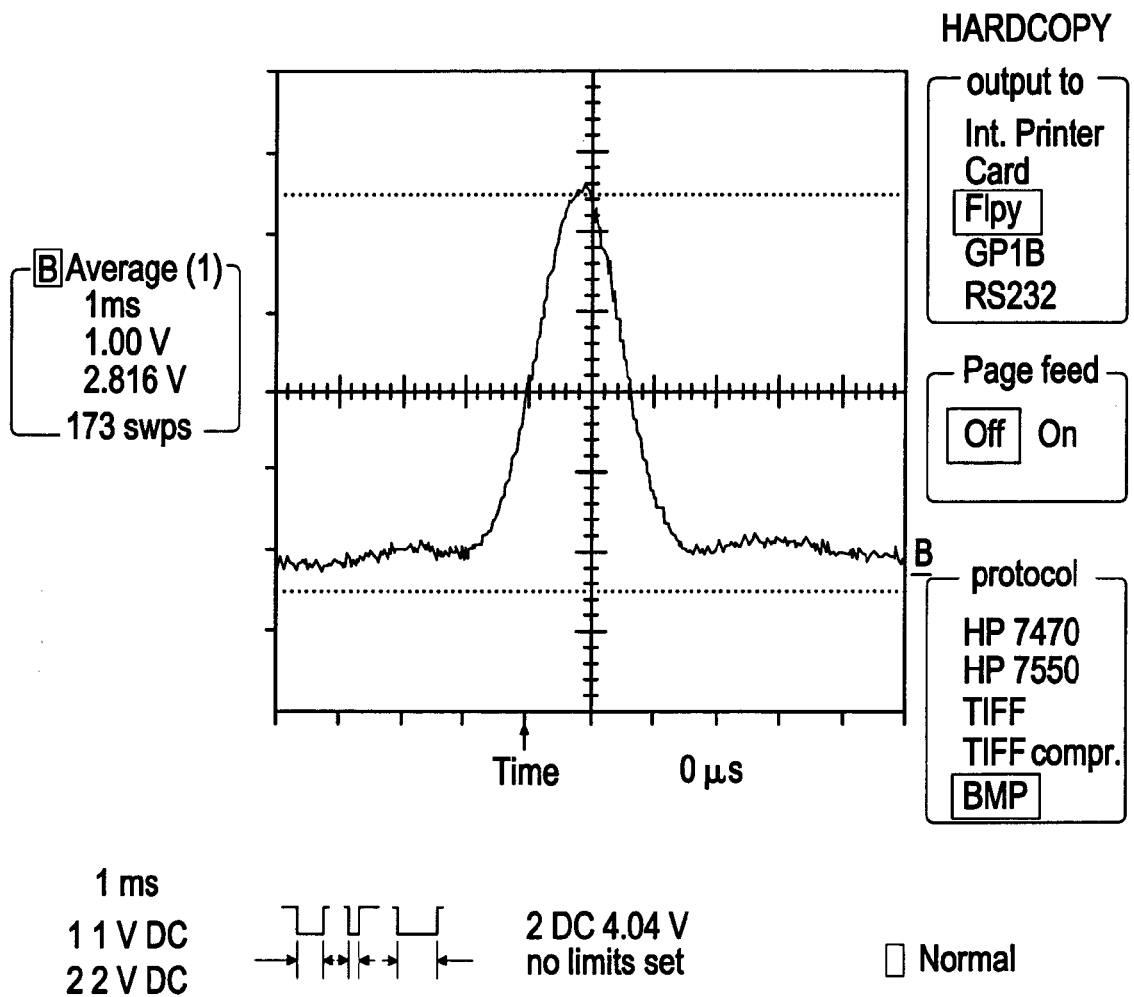
Figure 10B:
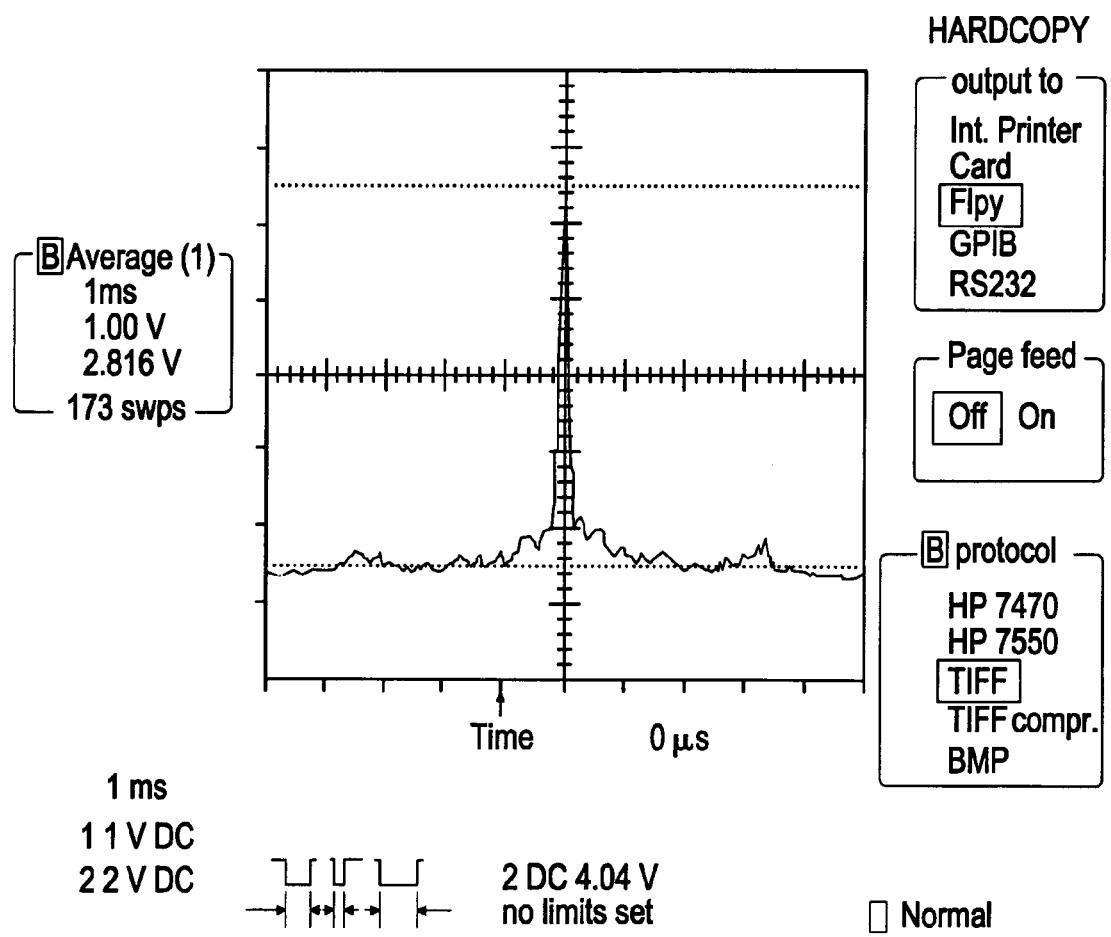
Figure 10C:
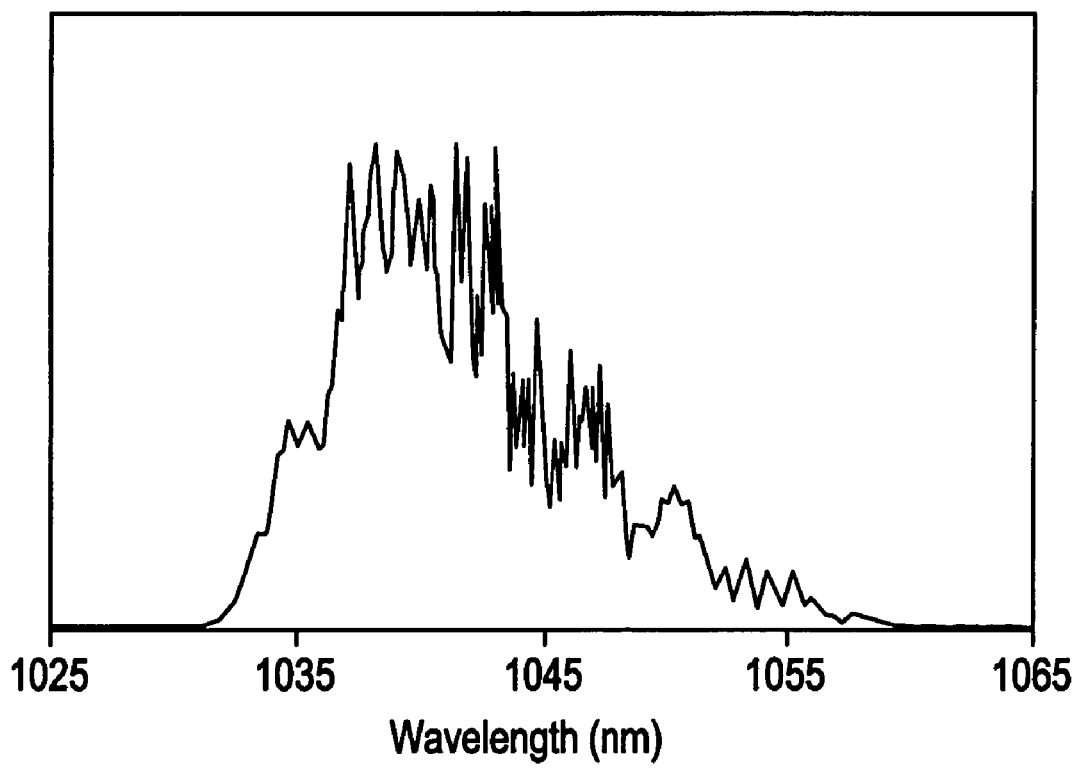

FIGS. 10A and 10B illustrate autocorrelations of output pulses in the 5 ps range and the 50 ps range. The spectrum of the output is shown in FIG. 10C.

Figure 11:
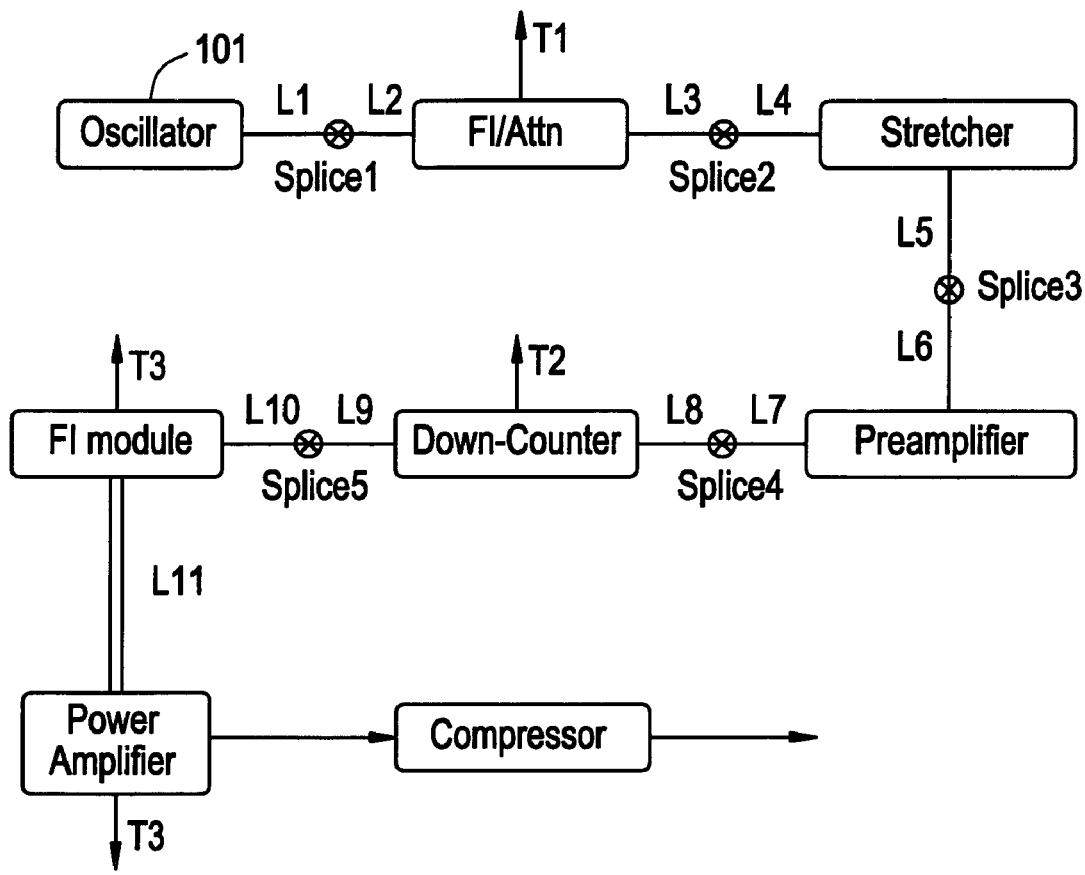

FIG. 11 illustrates the FCPA with 8 modules: oscillator, FI/attenuator, stretcher, pre-amplifier, down-counter, FI, power-amplifier and compressor.

Figure 12A:
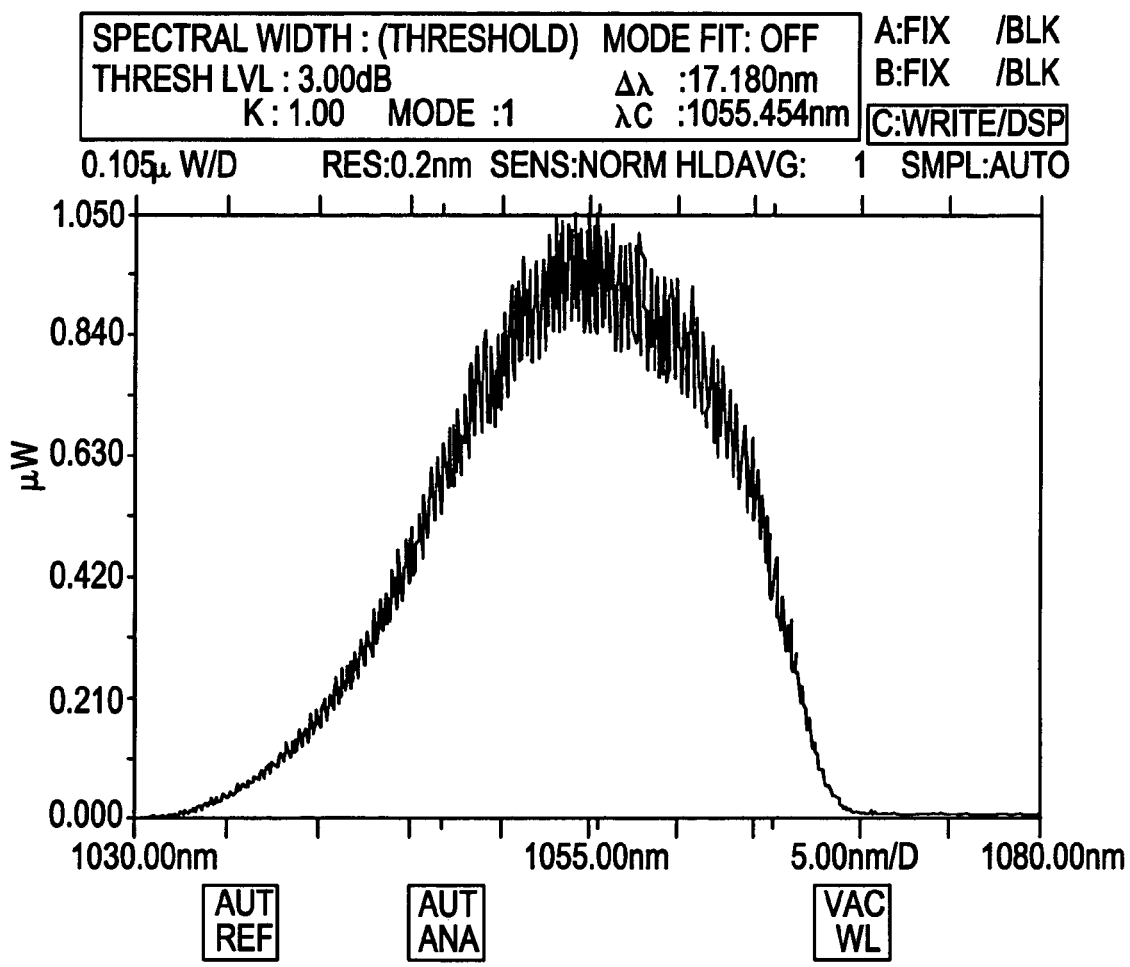
Figure 12B:
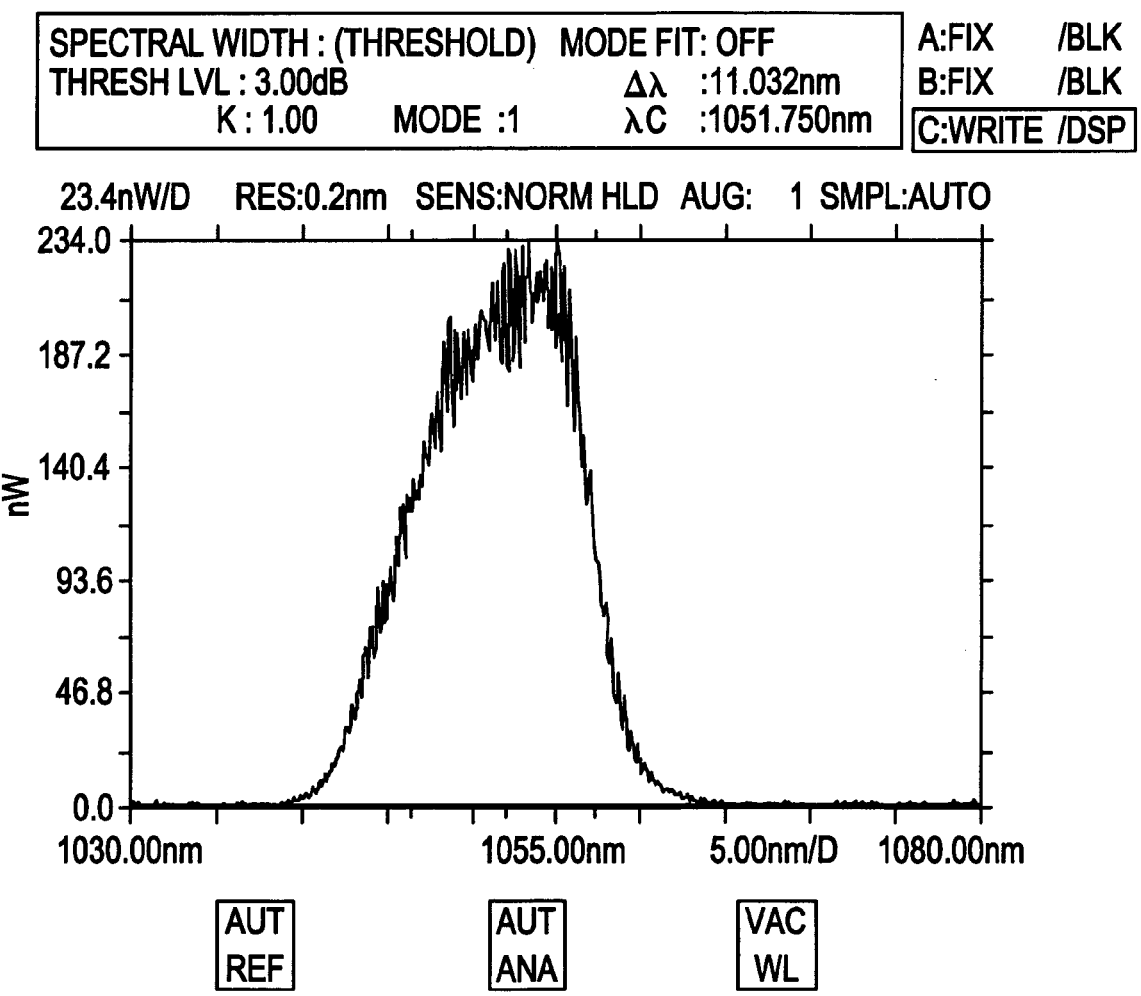

FIGS. 12A and 12B respectively illustrate the spectrum from the oscillator and the spectrum after the filter module stretcher as illustrated in the FCPA block diagram in FIG. 11.

Figure 13A:
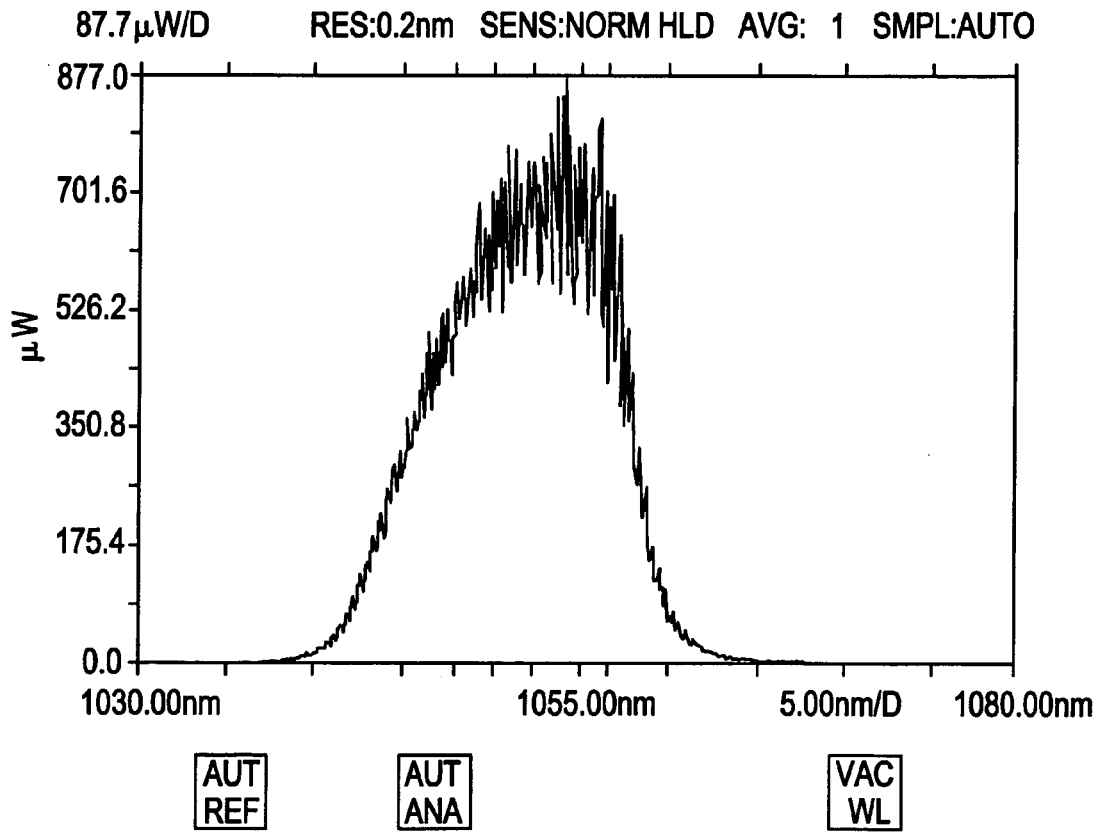
Figure 13B:
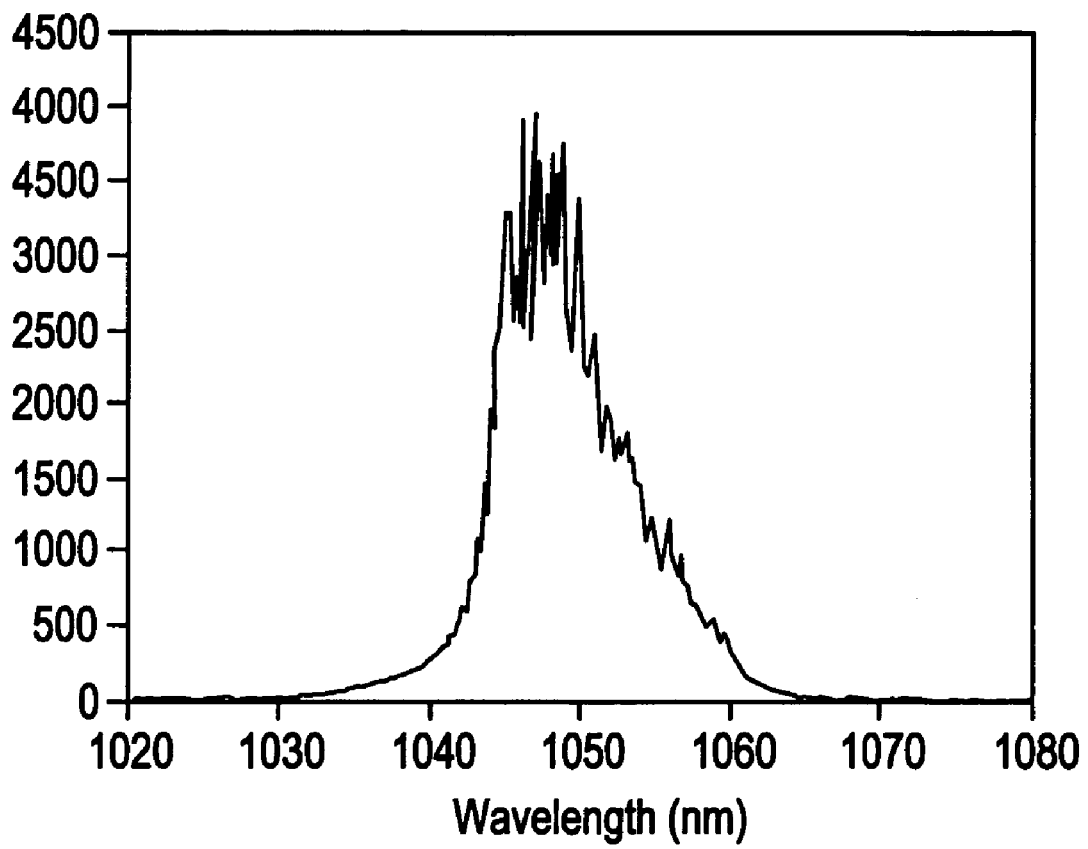

FIGS. 13A and 13B respectively show the spectrum after the preamplifier and the spectrum after the power amplifier as illustrated in the FCPA block diagram in FIG. 11.

Figure 14A:
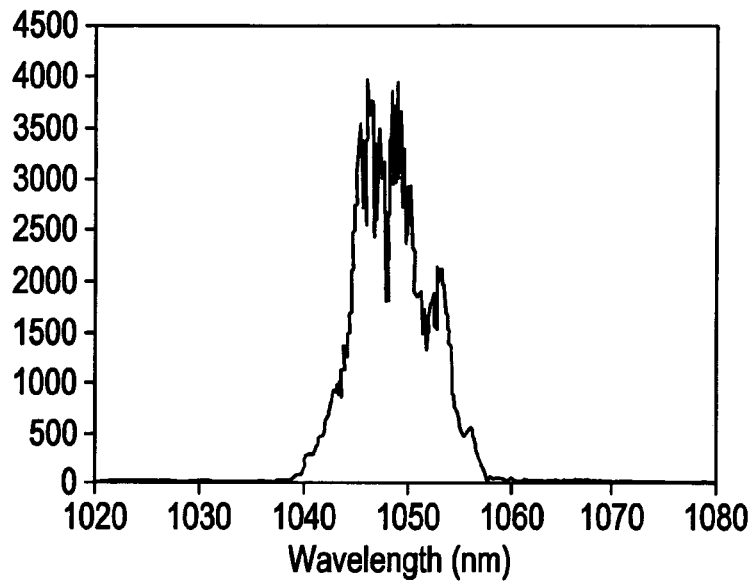
Figure 14B:
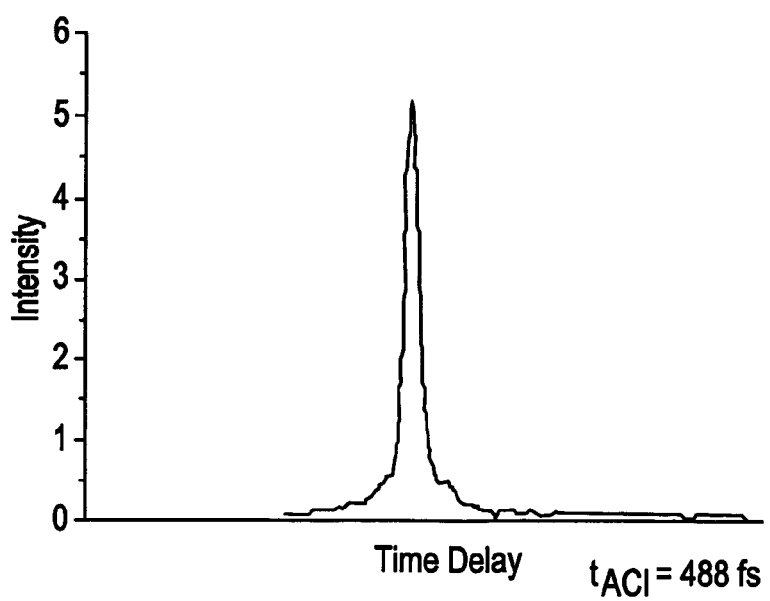

FIGS. 14A and 14B respectively show the spectrum after the compressor and the autocorrelation of compressed pulses for the FCPA illustrated in the block diagram in FIG. 11.

Figure 14C:
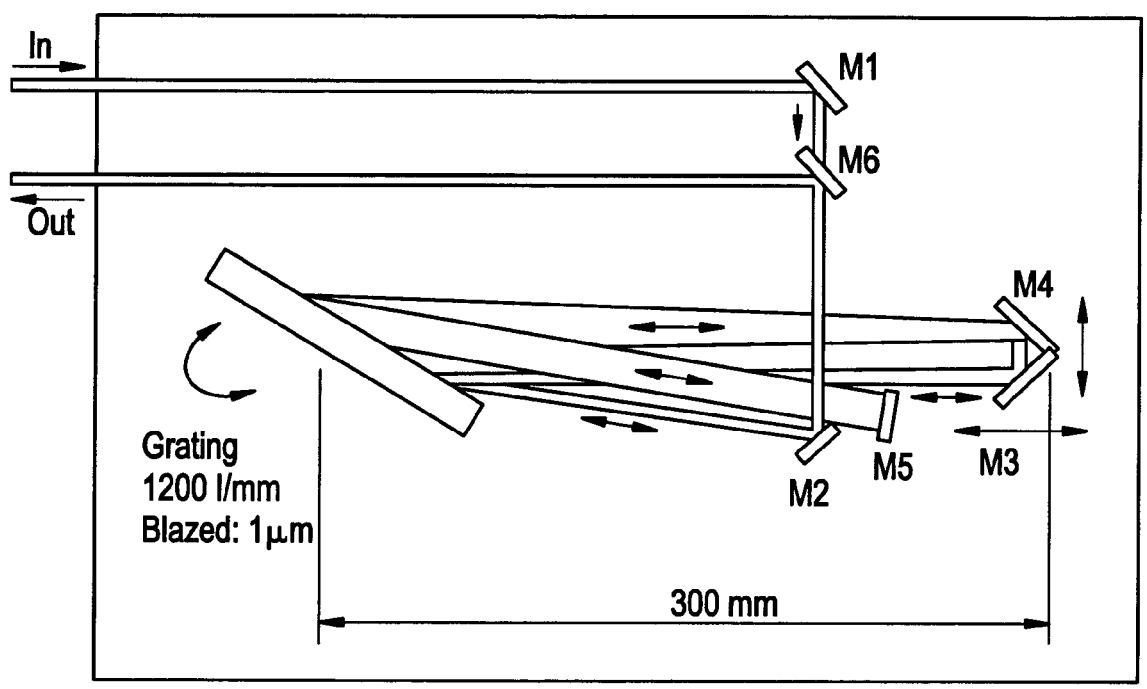

FIG. 14C illustrates an example of the compressor.

Figure 15:
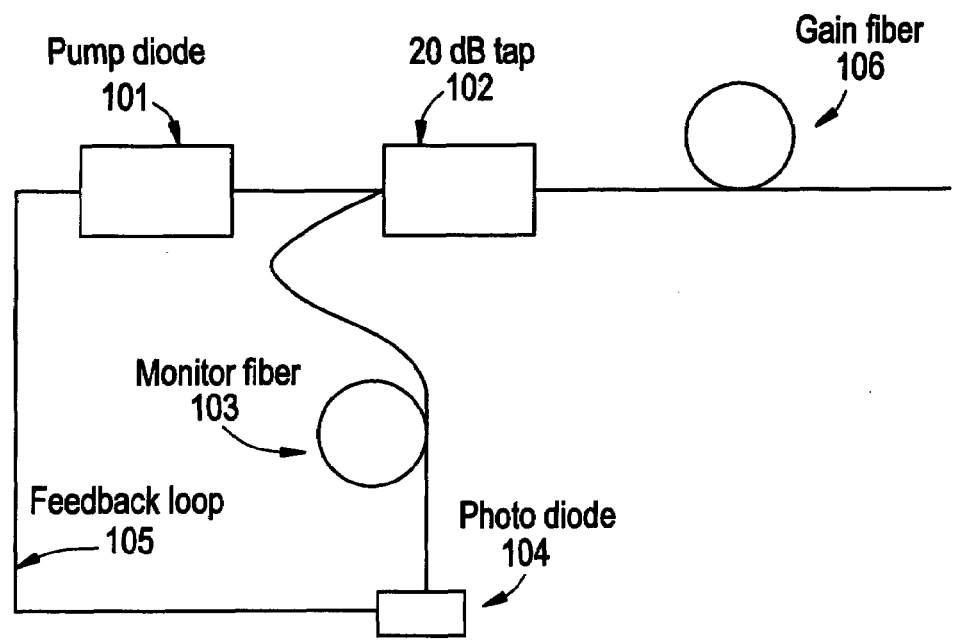

FIG. 15 illustrates a generic scheme for active adjustment of the pump diode chip temperature by monitoring the transmission of the pump light through gain fiber. The monitor fiber senses the internal package temperature.

Figure 16:
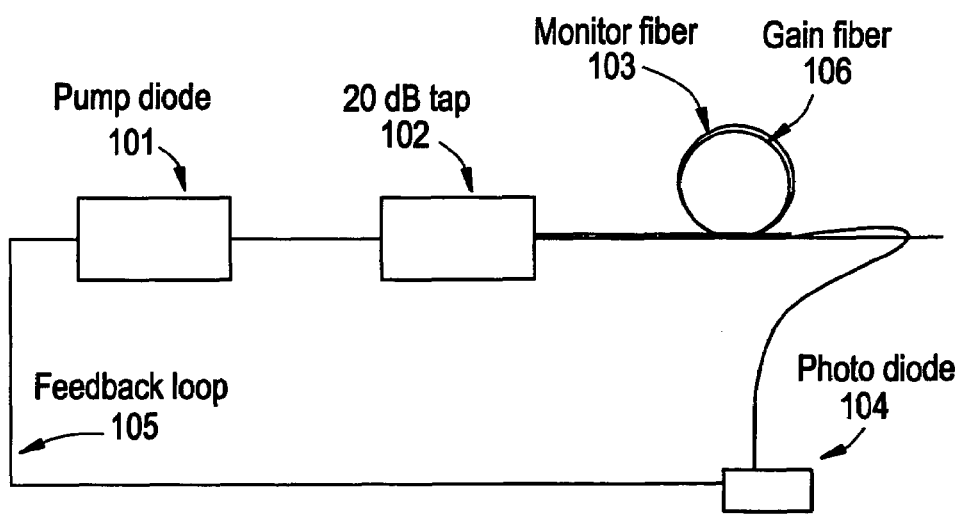

FIG. 16 illustrates a preferred embodiment for accurate following of the gain fiber temperature by integrating the sensor fiber in physical contact with the gain fiber.

Figure 17:
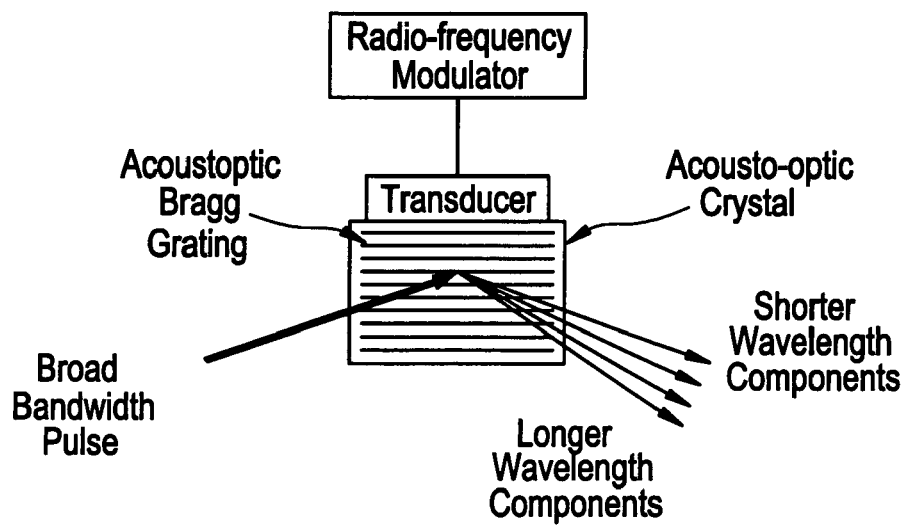

FIG. 17 shows an acousto-optic deflector illustrating the dispersive characteristics of an induced Bragg grating.

Figure 18:
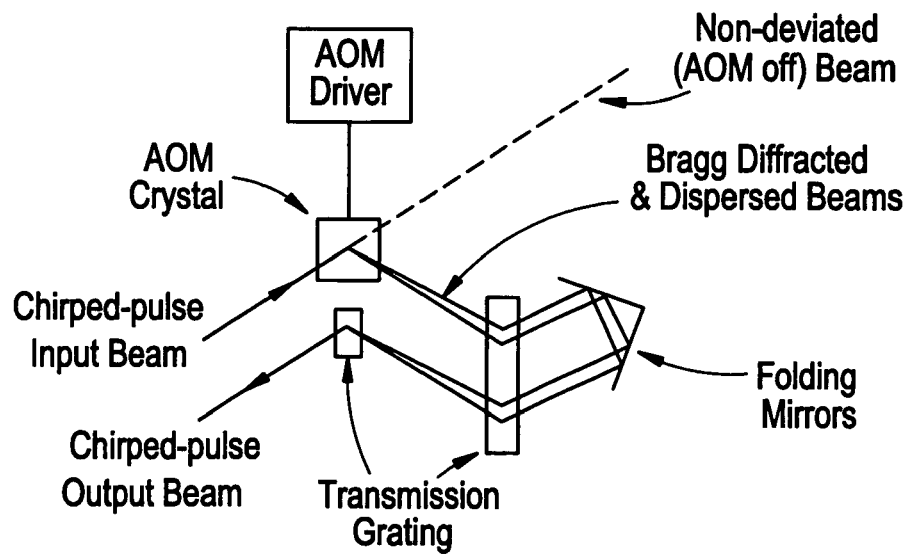

FIG. 18 shows a rudimentary two-pass chirped-pulse dispersion-compensated acousto-optic switch using transmission gratings.

Figure 19:
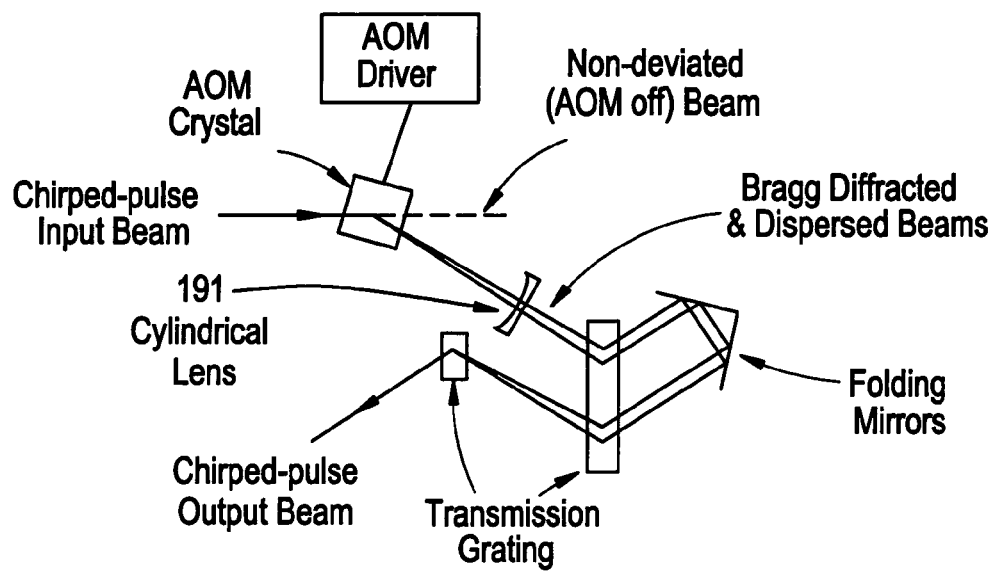
Figure 20:
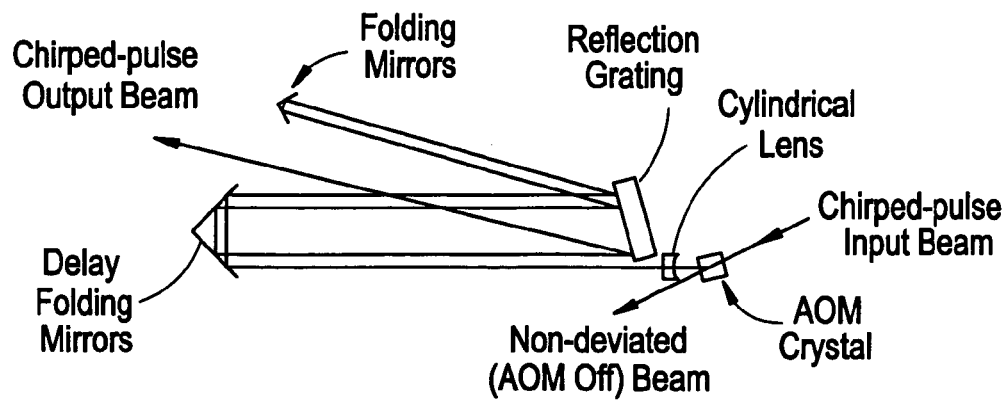

FIG. 19 illustrates a lens-enhanced a two-pass chirped-pulse dispersion-compensated acousto-optic switch using transmission gratings; and FIG. 20 shows an example of a lens-enhanced four-pass chirped-pulse dispersion-compensated acousto-optic switch using a reflection grating.

DESCRIPTION OF THE PREFERRED EMBODIMENTS

FIG. 1 represents a block diagram of a modular all fiber-based chirped pulse amplification laser system, modules that are first assembled separately, tested and then assembled into a system. Each module is designed to be easily replaceable. The block diagram shows eight modules: Oscillator, FI/Attenuator, Nonlinear amplifier, Stretcher, Pre-amplifier, Isolator/Down-counter, Power-amplifier and Compressor. Most of the modules have fiber in/out leads and can be characterized separately. After qualifying the module specifications, they are spliced together with standard PM-PM splices.

The modules are made up of a series of optical components that are packaged by Telcordia-qualified technology adapted from the telecommunications industry. FIG. 2 illustrates two typical packages. The first is the attenuator module. Linear polarized light is input into the module from Fiber #1. The half-wave plate can be rotated to rotate the linear polarization state. A polarizer follows the wave plate. The relative angle of the linear polarization state to the polarizer will determine the attenuation of the signal that is launched in the output fiber #2. The attenuator module can also have another function. There can be some degradation of the polarization state by nonlinear processes in the fibers, the use of short non PM fiber lengths or a slight mismatch of the polarization axis in splicing two PM fibers. Pulses propagating along the second polarization state create satellite pulses that are undesirable. This problem is discussed in more detail in Ser. No. 10/627,069 (incorporated by reference herein). The wave plate is rotated so the polarizer rejects the light that is propagating in the unwanted polarization axis of Fiber 1. For this purpose a second ½ wave plate may be placed following the polarizer to assure that the correct polarization of fiber 2 is launched. In certain critical locations, it may be desirable to use an attenuator module in place of splicing two PM fibers.

The second module is a pigtailed tap point. This module, as illustrated, has two roles. One is to isolate the input module from following modules. This is accomplished with the isolator. The second purpose is to give a tap point. The tap point allows a small of amount of the signal to be picked off as a diagnostic. The pickoff plate typically reflects a fraction of light off its front surface and the back surface can be anti-reflection coated to reduce the reflection. Often the front surface is uncoated and Fresnel reflection from the glass pick-off plate is utilized. This is a critical element in obtaining optimum operation of this system. Once the system is spliced together it would not be possible to obtain a signal from each module in order for optimization during manufacturing or during service of the laser.

Figure 1A:
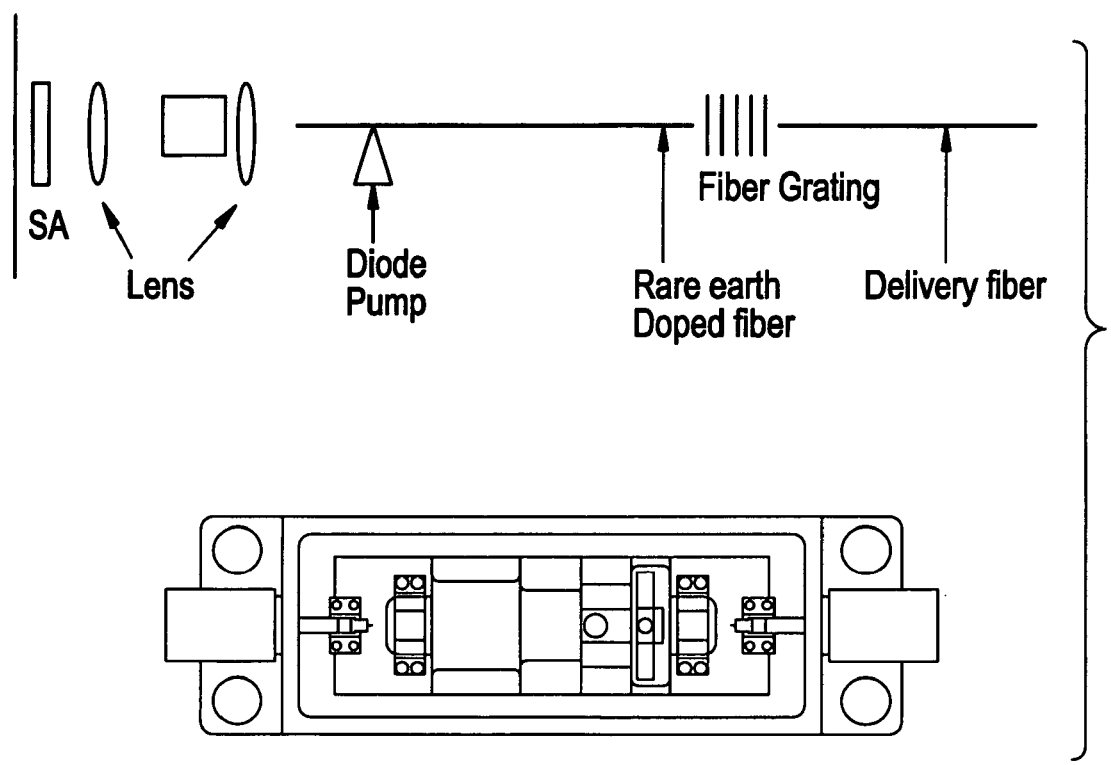
FIG. 1A illustrates an exemplitive oscillator.
Figure 5A:
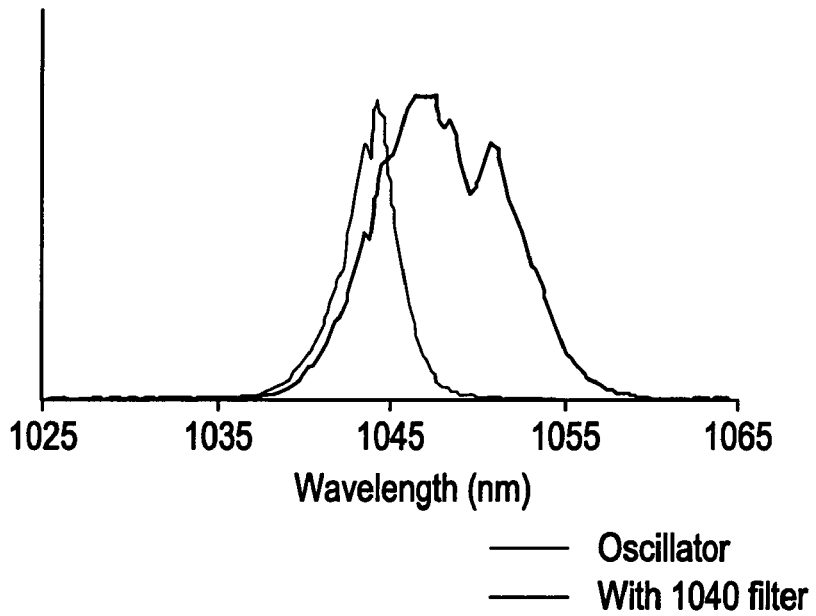

The first module 101 may be an ultrafast oscillator as is described in any of Ser. No. 10/627,069 "Polarization Maintaining Dispersion Controlled Fiber Laser Source Of Ultrashort Pulses" (incorporated by reference herein), IMRA Reference No. IM-108 "High Power Short Pulse Fiber Laser" (Incorporated by reference herein), and (IMRA Reference Number IM-106 "High power ultrafast fiber MOPA source and its application in frequency metrology" (incorporated by reference herein). FIG. 1A, reproduced from IM-108, shows a preferred arrangement of this oscillator. The oscillator is based on two sub-modules, the saturable absorber module and a pump laser module, a gain fiber and a fiber grating output coupler. It is clear that this module can be preassembled and tested before integration. The spectral output is shown in FIG. 5(a). The oscillator produces a 12 mW output with 1 amp. pump diode current (34° C.). The repetition rate is 48 MHz. The center wavelength is 1048.8 nm, and the bandwidth is 8.6 nm.

Figure 5B:
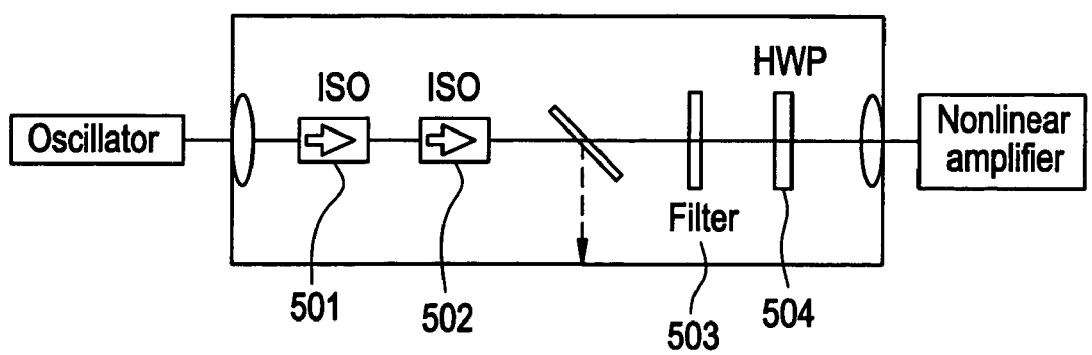

The FI/attenuator module follows the oscillator. The particular components are shown in FIG. 5(b). It is a combination of the attenuator and tap point packages shown in FIG. 2. Rotating the second isolator 502 relative to the first isolator 501 attains the attenuation. The half-wave plate 504 rotates the polarization stage to match the axis of the PM fiber. The filter 503 has a spectral width of 10 nm and is centered at 1040 nm. Since the spectrum of the oscillator is centered at 1048.8 nm, the spectrum of the transmitted light is narrowed to about 2 nm and the peak is shifted to about 1043 nm. It is very desirable to have this filter between the oscillator and the first amplifier in order to modify the spectrum of the oscillator. Other types of filters such as fiber bragg gratings can be utilized in this location as is pointed out in IM-108. This module is used to attenuate the output to 1.4 mw. In FIG. 5(b) it can be seen that two isolators are used. This has been found necessary in order to give sufficient isolation of the oscillator from the first amplifier. 50 db isolation is ideally desired, however >35 db is normally sufficient. This level of isolation requires two isolators at this time.

Figure 1B:
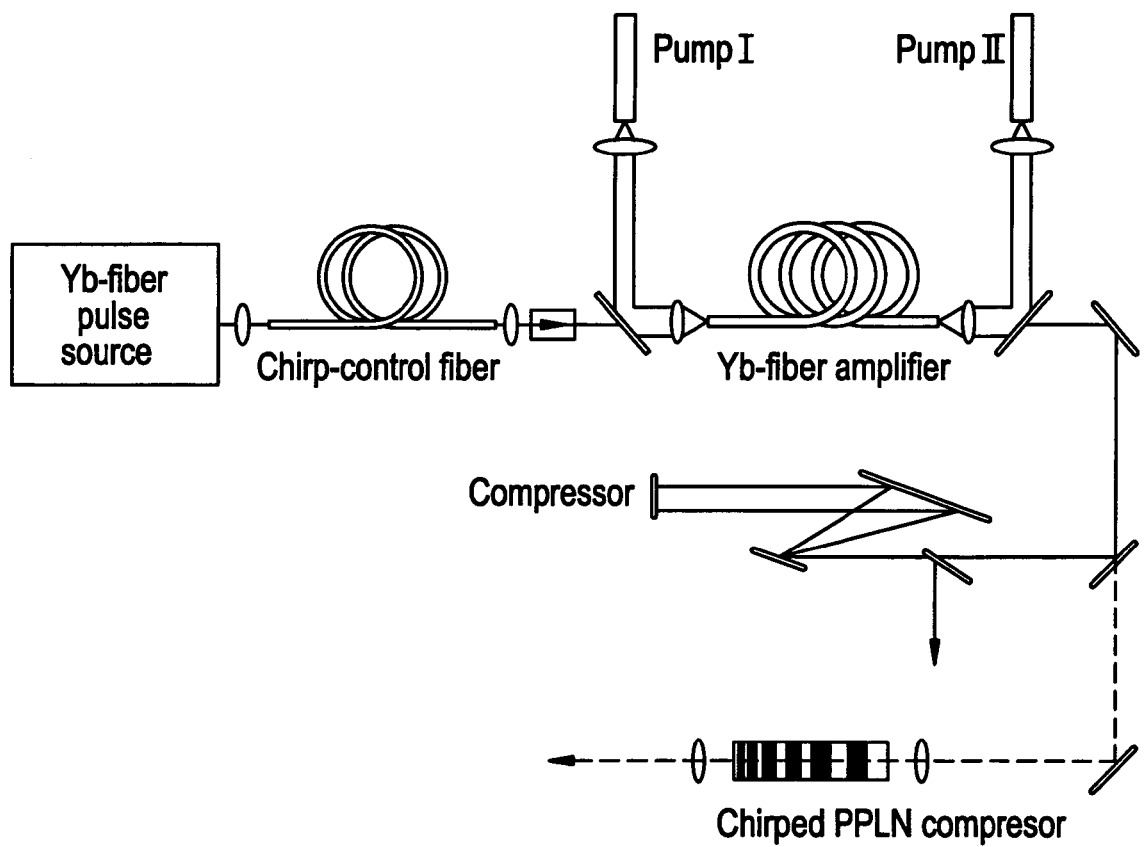
FIG. 1B shows an example of a co- and counter-pumped fiber amplifier, which may operate as a non-linear amplifier or power amplifier.
Figure 1C:
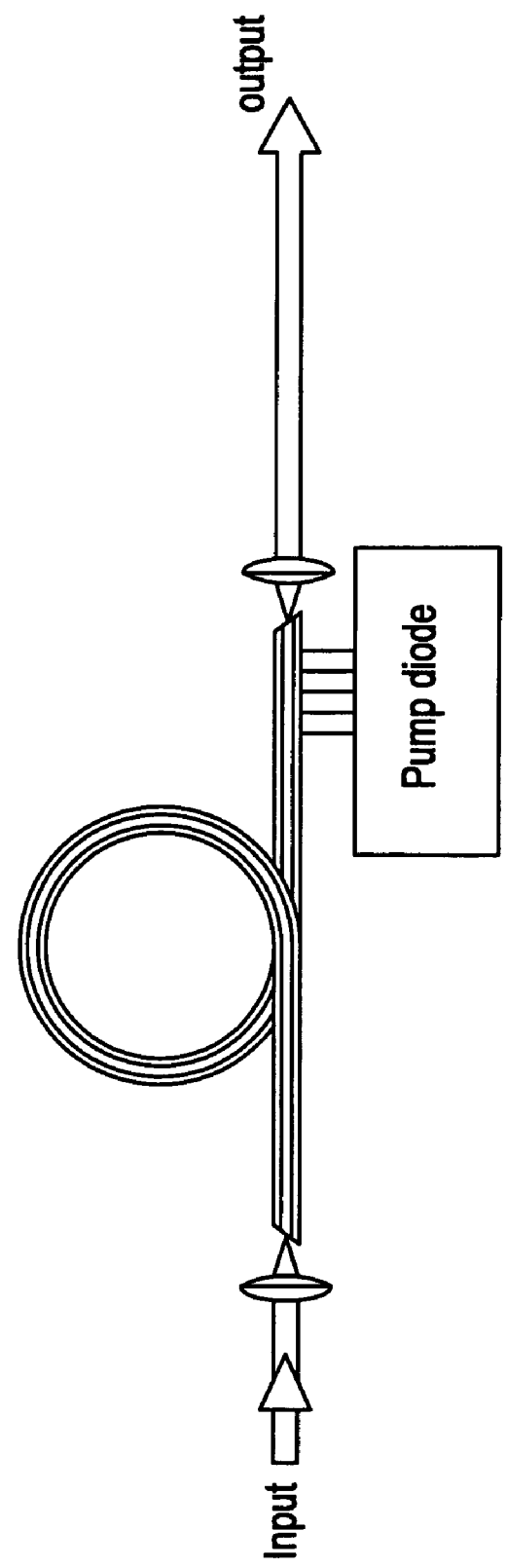
Figure 6A:
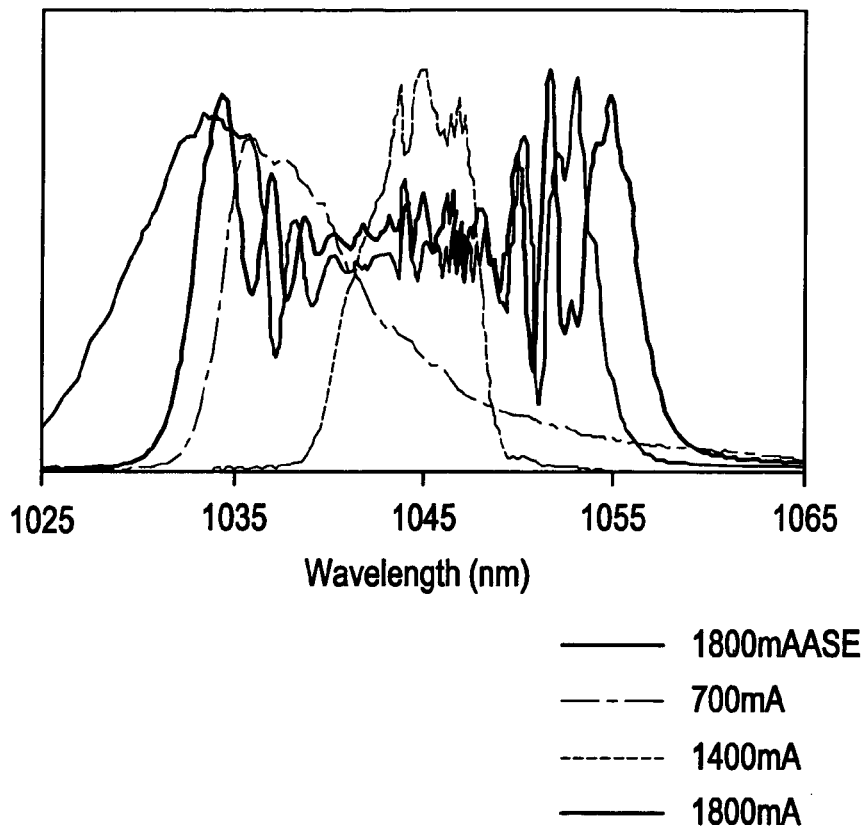

The next module is the nonlinear amplifier. It is nonlinear due to the fact the pulse is not temporally stretched so that the amplification takes place with high intensity and thus significant self-phase modulation. Typical amplifier configurations are shown in FIG. 1B (a co-propagating and counter-propagating pumped arrangement) and FIG. 1C (a side-pumped arrangement), although the precise configuration can be selected from many known amplifier designs. The spectrum at the output of this amplifier is shown in FIG. 6(a). For higher pump currents the spectral width is over 20 nm. Thus in this nonlinear amplifier the spectral width has been increased by self-phase modulation by more than a factor of 10, from about 2 nm over 10 times to greater than 20 nm. The amplifier is a Yb-doped cladding pumped fiber that is 4 meters long. In FIG. 1C, It is side-pumped with counterpropagating pumping. Even at the lowest current the spectrum has been broadened by self-phase modulation. At the higher current levels, the spectrum is typical for self-phase modulation propagating in a fiber with positive dispersion. Compare these spectra to that shown in FIG. 7, reproduced from Govind P. Agrawal, Nonlinear Fiber Optics (Academic Press, Inc. New York, 1989).

A nonlinear Yb amplifier with positive dispersion, usable in this invention and which has been utilized for pulse amplification of a substantially unchirped pulse that is significantly spectrally broadened during the amplification and which can be pulse compressed after amplification is disclosed in Ser. No. 10/437,057 "Inexpensive variable rep-rate source for high-energy ultrafast laser" (incorporated by reference herein). In these systems, highest gain and efficiency are not the predominant concern as in the case of other amplifiers. The gain of about 100× in this stage is rather low for a fiber amplifier. The focus here is to obtain the highest pulse energy in a pulse that can be compressed.

Another feature of this amplifier is that the ASE peak is separated from the signal peak. Normally an amplifier fiber is optimized for efficiency by uniform pumping of the fiber length. In this case, the gain peak and ASE peak overlap. To move the gain peak to longer wavelengths and the ASE peak at the output to shorter wavelengths then nonuniform pumping is utilized. In erbium and ytterbium amplifiers there is more loss at shorter wavelengths from unexcited ions. There are more unexcited ions in an amplifier if high concentrations of active ions are utilized. There are fewer unexcited ions when the excitation levels are higher. High excitation thus reduces the loss at shorter wavelengths. Therefore the gain peak can be moved away from a longer laser wavelength by pumping an end of a fiber to high excitation levels. The highest concentrations of active ions are utilized while maintaining high efficiency of the fiber. In cladding pumped amplifiers, the core diameter is made large and the cladding diameter is made as small as possible while coupling the pump diode light into the fiber. This design also reduces the energy density in the fiber due to the large core diameter and all of the gain can be concentrated at the output end of the fiber. This optimizes the pulse energy due to the reduction of the nonlinear effects in the fiber. However, if additional nonlinearity is desired the core diameter can be reduced or the laser diode can be detuned off the absorption peak of the amplifier and the gain is made more uniform. The fiber length is optimized for output power at the lasing wavelength. A longer length can be used with a small loss in efficiency to further shift the peaks apart, particularly for backward propagating ASE. Other components after the amplifier can be used as a filter to separate the ASE from the signal. The final compressor can be used for this purpose.

Figure 6B:
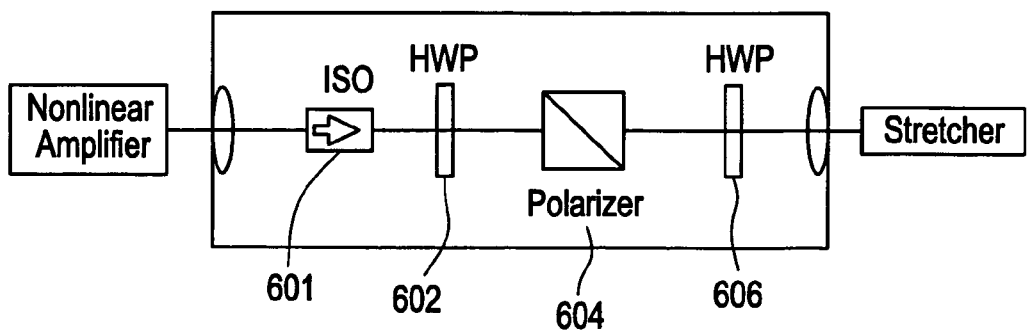

The module between the nonlinear amplifier and the pulse stretcher is shown in FIG. 6B. It contains an isolator 601 and a polarizer 604 with half-wave plates 602, 606. With nonlinear optical processes, polarization of the pulse can be altered by nonlinear polarization rotation. Since the fiber is birefringent, light propagating along the other polarization axis of the fiber travels at a different speed and can interfere with the main pulse in subsequent stages. For good pulse quality it is thus necessary to maintain polarization fidelity with polarization elements between the different stages. Thus, this module may be inserted between other modules in the system as necessary. This module is a combination of the attenuator and tap point module as is shown in FIG. 2.

The stretcher is a fiber that is single mode, PM and 200 M long. It stretches the pulse by >200 times to 120 ps as is shown in FIG. 8A. Other temporal pulse stretchers can be utilized such as the nonlinear fiber grating that is disclosed in Ser. No. 10/606,829 and Ser. No. 10/608,233 (incorporated by reference herein).

After the stretcher is the preamplifier. This amplifier, like the nonlinear amplifier, is Yb-doped cladding pump fiber that is 4 meters long. It is side-pumped with counterpropagating pumping. Thus the design is the same as the nonlinear amplifier, but as the pulse is now stretched, nonlinear affects are avoided.

The down-counter module follows the preamplifier. The optical layout of the down counter is shown in FIG. 3. The principal component of the down counter is an AO modulator 350. Its function is illustrated in FIG. 4. The AO modulator has a window of about 10 ns. Its purpose is to select one pulse out of the train of pulses from the mode-locked oscillator operating at 50 MHz. The down counter electronics determines how often a pulse is selected and hence the repetition rate of this amplifier. For example if one out of every one hundred pulses is selected from the 50 MHz oscillator, then the amplifier repetition rate is 500 KHz. The down-counter module can have other functions. The use of two lenses 360, 370; 380, 390 before and after the AOM gives a section of collimated light. At these points other components can be placed such pick-off windows 325, attenuators or filters 335. FIG. 8B shows the spectrum after the down-counter module. It can be seen that the wings of the spectrum and the large modulations have been removed. This is desirable since the wings cannot be compressed and the large modulations would cause self-phase modulation in the final amplifier, since self-phase modulation is related to the derivative to the light intensity. In this case an optical filter was not used. In this case the preamplifier was used as a spectral filter. Its gain bandwidth is narrower than the spectrum from the nonlinear amplifier. Additional or alternative filtering could be caused by the down counter and would be related to the chromatic aberration from the lens system and the spectral dispersion in the AOM. In this case, the spectral throughput is adjusted by the alignment of the output fiber. The dispersion in the AOM will be described in more detail later.

The next module is the power amplifier. Amplification is generally linear here, since the pulse has been stretched before amplification, which lowers peak pulse energy. A single-pass, end-pumped amplifier module is typically used. The amplifier fiber is polarization maintaining with a 30-µm core diameter and 250-µm cladding diameter. The length is 3 m. The pump laser diode is operated at 14 W. It is typically end pumped in the counterpropagating direction. FIG. 1B shows counterpropagaing pumping with Pump II and copropagating pumping with Pump I. The laser diode or an array of laser diodes is typically coupled into a fiber bundle. It is found advantageous to use two fiber bundles where the connection or splice is on the outside of the laser enclosure. In this manner the fiber bundled diode can be replaced without contaminants getting into the optics of the end-coupled unit. Fiber bundled ends are also not consistent in their output so replacing the bundle directly tends to misalign the end coupled unit. At this point, the amplifier generates 1.01 W output at 200 kHz repetition rate. The spectral profile is shown in FIG. 9. Again the spectrum is narrowed from the amplifier. The amplifier also operates as a spectral filter. The wings of the self-modulated pulse are not compressible so the filtering helps the fidelity of the pulse.

The last module is the bulk-grating compressor. The design as shown in FIG. 14C is a folded Martinez-type configuration. Typically we use a conventional design compressor as is shown in U.S. Pat. No. 5,847,863. However by utilizing the retroreflecting mirror M4, a single grating can be used. The grating is 1200 l/mm blazed at 1 micrometer and used at the littrow angle. The output is 405 mW at a 200 kHz repetition rate. Thus a 2-µJ pulse is generated. The duration measured by the autocorrelator is 488 fs. This gives a 345 fs pulse width assuming a Gaussian pulse shape as is shown in FIGS. 10A and 10B. The spectrum is shown in FIG. 10C. Again the spectrum is reduced where the grating compressor is operating as a filter that filters out the wings that are not compressible. It should be noted that the spectrum has high frequency modulation due to polarization interference. This shows the importance of maintaining the polarization fidelity in this amplifier. This leads to a longer pulse background as is shown in FIG. 10B.

A block diagram of a second embodiment is shown in FIG. 11. The major difference in this embodiment is that the pulses are stretched before the first amplifier. Thus, in this design, nonlinear optical processes are minimized in the amplifiers. The advantage of this system is that reproducibility from system to system is easier to attain. However, the seed bandwidth from the oscillator has to be broader after the filter and before the stretcher (12-14 nm compared to 3 nm). The spectrum of the oscillator and after the first filter module is shown in FIGS. 12A and 12B. It is critical to have a filter between the oscillator and the rest of the system. At this point the spectral characteristics of each amplifier are not sufficiently the same to operate a system without a filter. The filter can be placed before the stretcher or after. If it is placed before the stretcher, then an attenuator module is used with this module. If the spectrum is filtered before the stretcher it is necessary to keep the amplitude of the input pulse sufficiently low to prevent nonlinear effects in the stretcher from changing the spectrum. The attenuator is used for this purpose. It should be noted that the high frequency noise on the spectrum in FIGS. 12a and 12b is caused by polarization imperfections. This illustrates the need for polarization modules between fiber sections. To fully prevent any high frequency noise a polarization module could be placed at each PM to PM splice. However, this is an over-engineered design for this system. Since the light at the wrong polarization accumulates in the system, polarization modules are placed primarily where it is convenient, such as part of another module.

The spectrum from the preamplifier and the power amplifier are shown in FIGS. 13A and 13B. It will be noted that no noticeable nonlinear affects are taking place in the amplifiers. There is also some narrowing of the spectrum from gain narrowing. The spectrum of the output from the compressor is shown in FIG. 14A with the autocorrelation shown in FIG. 14B. As with the first embodiment, the pulse duration measured by the autocorrelator is 488 fs. This again gives a 345 fs pulse width assuming a Gaussian pulse shape. The output is 440 mW at a 200 kHz repetition rate. Thus a 2.2-µJ pulse is generated.

In order to be able to recompress the pulses, the spectrum of the output must be limited to 7-9 nm when a fiber stretcher and a bulk-grating compressor are used together. In order to get this spectral width the initial width needs to be broader since the amplifiers have some gain narrowing. In the case of the nonlinear amplifier, additional narrowing and filtering is necessary to get rid of the spectral wings that are not compressible. In the case of the nonlinear amplifier, the spectral width was near 20 nm after the amplifier while for the linear amplifier the spectral width after the preamplifier was about 9 nm.

Therefore, the nonlinear amplifier has an additional sensitivity on the fluctuation of output power. With additional output, there will be additional self-phase modulation and the spectral width will increase. Thus, the gain in the nonlinear amplifier needs careful control since the spectral characteristic will change with gain. In the first embodiment using the nonlinear amplifier, such careful control is needed however, control is also desired in the second embodiment. In this case the amplifier uses v-groove pumping (as disclosed in U.S. Pat. No. 5,854,865, incorporated by reference herein) in combination with a double-clad fiber for coupling high intensity pump light into the fiber using a high power broad strip diode chip. However, a drawback of this scheme is the lack of accurate locking of the pump wavelength. Due to the v-groove pumping directly from the laser diode, incorporation of a fiber Bragg grating is not feasible. A narrow band dielectric coating on the chip facet will not solve this problem. Further, even though the chip is kept at a predetermined set temperature, the actual chip temperature varies slightly due to bias current and the heat sink temperature.

Furthermore, in a system comprised of rare earth-doped fiber, such as Yb, with a high temperature sensitivity, the mismatch of the absorption spectrum with the pump spectrum over the environmental temperature range is a significant issue in stabilizing the laser or amplifier output. The temperature dependent gain of rare earth doped fiber results both from spectral variation of the absorption cross section and from the radiative recombination rate over temperature. In regard to the spectral absorption cross section, a spectral shift and broadening/narrowing occur due to thermally populated optical transition states upon fiber temperature change. In an Er—Yb system an absorption change up to −2 dB has been observed over 25 to 60° C. fiber temperatures by the shift and broadening/narrowing effect of the absorption spectrum. (See, K. W. Quoi et al., Journal of Lightwave Technol. Vol. 10, 1992, p 847) In fact such temperature dependent absorption in a rare earth-doped fiber can be exploited for temperature sensing. (See, K. W. Quoi et al., Journal of Lightwave Technol. Vol. 10, 1992, p 847)

If a Yb-fiber is combined with an unlocked pump wavelength, which is mostly the case for v-groove (side) pumping or multimode diode pumping, it is difficult to build a reliable laser or amplifier with a high output stability over a wide range of operating temperature. An absorption change of 10% over 10-50° C. of fiber temperature can be easily observed in a double clad single-mode Yb fiber with a >−10 dB absorption length at 976 nm. This temperature sensitivity is especially critical for an oscillator where the gain fiber is not in a saturation regime. A precise match of the pump spectrum with the absorption spectrum over all operating conditions are necessary. The narrow absorption peak at 976 nm, which has the highest wall plug efficiency for Yb pumping, is sensitive to the pump wavelength distribution. A slight variation of the absorption spectrum, especially a spectral shift over temperature, will easily result in an unacceptable variation of the output. The full-wave half-maximum of the 976 nm absorption band is about 7 nm, thus a control of the pump wavelength distribution within 1-2 nm is necessary in order to achieve system stability within +/−2%.

The need for control is not limited only to the spectral distribution, but also temperature and diode current. One way of implementing such controls is to include a feedback loop as disclosed below. In this way, broadening or narrowing of the absorption efficiency is reproduced in the monitor fiber as the fiber temperature changes. Compensation for the efficiency change can be implemented by adjustment of the pump diode current.

This method of controlling pump dynamics by monitoring the output power of an amplifier with a low repetition rate (for example, <200 kHz) is not a proper solution if pulse-to-pulse stability is important. Such a feedback loop requires at least two sequential pulses detected before adjusting the pump. The invention, for monitoring the pump spectrum, disclosed herein is based on continuous wave mode. Depending on the speed of the feedback loop electronics, pulse-to-pulse fluctuation can be eliminated completely.

The absolute temperatures of the cores as between the gain and monitor fibers can deviate from each other due to the fact that the gain fiber is subject to high optical pumping. However, the method disclosed herein is based on the relative change of the fiber optics characteristics. Thus an absolute temperature offset does not detract from the concept of the invention.

FIG. 15 represents this further embodiment of the invention. The pump light from diode source 101 is tapped at 102 for a feedback loop 105. Typically, the tap ratio needs to be −20 dB. The monitor port is spliced with a piece of Yb fiber that is optically identical to the gain fiber. The length of the monitor fiber 103 can be conveniently adjusted depending on the electronics, including the photo diode 104. The electronics regulates the diode temperature so that the transmission through the monitor fiber is at a minimum, corresponding to the optimal matching of the pump wavelength distribution within the absorption band of the gain fiber 106. The monitor fiber can be packaged inside the system so that the temperature of the monitor fiber is in close proximity to that of the gain fiber.

A tap between the laser diode and the amplifier is not always possible. This is particularly true with the V-groove side-coupling module. There are alternative methods to obtain diode pump light for the monitor fiber such as to pick off scattering or spurious reflections in the side-coupled unit. Bend losses from the amplifier fiber can be used on the initial section of the amplifier. Another alternative is to use the gain fiber itself as the monitor fiber. The tap is then the light that has passed through the amplifier. For controlling the nonlinear amplifier in embodiment one, the tap point in the filter, isolator and attenuator module shown in FIG. 5B can be used. However, the light will be reflected off in the opposite direction from the reflection optics and an additional window is necessary. It should be mentioned again that the nonlinear amplifier is pumped in a counter-propagating direction so this pump light has traveled through the nonlinear amplifier fiber.

FIG. 16 shows an exemplary embodiment of the invention for more precise sensing of the gain fiber temperature. The monitor fiber is brought into thermal contact with the gain fiber. The proper length of the monitor fiber can be adjusted by fusion-splicing it with an undoped transmission fiber.

In a further embodiment, an AOM is added near the end of the system for selecting pulses for applications such as micromachining. Although continuous pulse output is sometimes acceptable, the user often requires that one or more pulses be selected and delivered to the application upon demand. As aforementioned, for nanosecond or longer pulse lasers, an acousto-optic deflector or modulator (AOM) can usually be used to select a pulse by deflecting it to the required application. However, the dispersion of an AO Bragg grating, along with the high spectral bandwidth of a chirped pulse, prohibits a simple solution for ultrashort pulse lasers.

As shown in FIG. 17, the constituent wavelength elements of a chirped pulse deflected by a Bragg-grating are disperse spatially, thereby resulting in a so-called spatially chirped pulse, which is detrimental for most applications. Also, it is generally required that there exist a high contrast between the selected and delivered pulses and the alternate state. Configurations, where the selected pulse is undeflected and the deflected pulses are discarded, is generally unsuitable for most applications as it has unacceptably low pulse contrast ratio.

In the principal (first) embodiment of the invention, utilization of the dispersive affect of an AOM Bragg grating on a chirped pulse operates as an improvement, rather than a limitation, to the design of an ultrashort pulse selector, with the advantage that this design lends itself to subsequent compression. The compression of a chirped pulse relies on dispersion of its constituent wavelengths to affect a differential path length delay between its leading and trailing components (see FIG. 18). The dispersive elements in a traditional pulse compressor are conventional surface-ruled diffraction gratings, although transmission gratings are also used. A novel aspect of this invention is to substitute one or more, but typically just the initial, diffraction grating of the pulse compressor with an AOM. Choosing to replace the first grating with the AOM, rather than any other, is driven by two considerations. One, mitigation of optical damage in the acousto-optic medium, as the 1st element of the compressor is subjected to the stretched pulse, which has lower peak power as compared to that at the $4^{th}$ element. Two, minimization of the physical size of the AO medium, as the aperture of the $2^{nd}$ and $3^{rd}$ dispersive elements of the compressor must be larger than the $1^{st}$ or $4^{th}$ so as to accommodate the spatially chirped pulse. Generally, the compressor is designed so that the optical path passes multiple times through each component to minimize cost and provide a compact configuration.

Although the feature of compression in this invention is usually of high value, if uncompressed pulses are required, the subsequent gratings may be "misaligned" to simply spatially reconstruct the pulse without compression.

The invention applies to compensation of dispersion of chirped pulses for any acousto-optic device. However, certain practical design considerations are important to the effective operation of the AOM as used herein. In order to attain high dispersion to match typical gratings, a relatively slow acoustic wave and high frequency driver is required. The optimum material for use in the visible and near infrared is tellurium dioxide, as it supports a slow shear wave that generates a grating applicable to this invention. Although this shear wave has a velocity appropriate to this application, it suffers from high attenuation that can limit the useful aperture of devices that use it. For devices that require an aperture of three or more millimeters, the AO crystal design may utilize an off-axis shear wave configuration. This design produces nearly the same low velocity wave, but with substantially lower attenuation.

A specific design can be calculated by starting from the Bragg Diffraction equation for the AOM.

$$\lambda_p = (2d/n)\sin\theta$$

where $\lambda_p$=photon wavelength
d=grating period
n=diffraction order, and
θ=diffraction half-angle.

Since the diffraction angle will be small (<<10°), use the paraxial approximation, i.e. $\sin\theta=\theta$. Thus, $$\lambda_p \approx (2d/n)\theta.$$

Now differentiating the above $$\Delta\lambda_p = (2d/n)\Delta\theta$$

The Bragg grating generated in an AO deflector or modulator is $$d = \lambda_S = c_S/f_R$$

where $\lambda_S$=sonic wavelength
$c_S$=sonic velocity
$f_R$=radio frequency

Combining the above two equations, and solving for Δθ yields $$\Delta\theta = n\Delta\lambda_p f_R / 2c_S$$

For a typical four-pass holographic transmission-grating compressor, which uses an 800 groove/mm, grating, and other typical parameters for an AOM, assume the following parameters:
n=1
$\Delta\lambda_p$=0.02 μm
$f_R$=350 MHz
$c_S$=617 m/s ($TeO_2$ shear wave)
Δθ≈0.0056 radians=0.33°

The dispersion from the 800 groove/mm grating corresponding to 0.02 μm is about 1°, thus we include a simple cylindrical lens 191 with angular magnification of 3 in the switch design. This design is shown in FIG. 19. Still alternately a telescope may be used. Alternately, reflection gratings (with concomitant lower diffraction efficiency, and cost) can be used.

However, even using the off-axis shear wave, attaining the required angular dispersion is difficult at a sufficiently low crystal driving frequency where attenuation of the ultrasonic wave is not excessive. In order to practically produce sufficient angular dispersion to match gratings in a typical compressor, the use of additional optical elements is advantageous. This can be accomplished with a negative (concave) cylindrical lens (see FIG. 19), a telescope (not shown), or other optical means, such as, but not limited to, a reflective element, of the appropriate power. The use of these ancillary optical elements with the AOM is an additional embodiment of this invention. The selection criteria to optimize the performance of this pulse extractor-compressor must consider driving frequency (wave attenuation), shear wave angle (attenuation and dispersion), and dispersion matching optics (physical size and complexity). Other configurations of switch and compressor are useful and advantageous, particularly where a higher compression factor is desired, such as, but not limited to a four-pass reflection-grating configuration as shown in FIG. 20. Double passing the AOM such as used in a regenerative amplifier is also suitable.

These embodiments implement a principal object of the present invention to extract and redirect a pulse or group of pulses from an essentially continuous series of pulses. The AOM deflects the extracted pulses to gratings or other dispersive means, which complete the spatial reconstruction of the pulse, with the option for compression, and directs the pulse or pulses to the user application. Unextracted pulses are not be delivered to the user application, but may be directed to other diagnostic means so as to establish the operating condition of the laser system prior to extraction of pulses for the application. This scheme is of value to measure performance of the laser output prior to delivery of the pulses to a critical application.

What is claimed:
1. A pulsed laser system, comprising:
a signal source;
a stretcher temporally stretching an output of said source;
a fiber amplifier;
a compressor recompressing an output of said amplifier;

an AOM selecting output pulses from said amplifier; wherein each of said signal source, said stretcher, said fiber amplifier, said AOM and said compressor comprise a pre-tested module, and said system is configured with at least said signal source, said stretcher, said fiber amplifier and said AOM optically connected via fiber splices;

at least one tap unit within or between ones of said modules, including means for picking off a portion of said signal for measurement of a spectrum within or between said modules;

at least one spectral filter, said at least one spectral filter being disposed external to said signal source and said fiber amplifier, and either before or after said stretcher, said filter having a wavelength sensitive characteristic that modifies a spectral shape of an output from said signal source and narrows the spectrum of the signal source output, wherein at least one of said tap units is located downstream of said filter and configured to enable measurement of said narrowed spectrum, and wherein said filter is disposed before said stretcher, and an attenuator module disposed between said signal source and said stretcher, said attenuator controlling an amplitude of a pulse emitted from said source so as to prevent non-linear effects within said stretcher from altering the pulse spectrum.

2. The pulsed laser system as claimed in claim 1, wherein said filter is packaged within a filter-attenuator (Fl/Attn) module.

3. The pulsed laser system as claimed in claim 1, wherein said at least one tap unit provides a small signal output to a diagnostic means, said signal output being provided during manufacturing or service of said pulsed laser system.

4. The pulsed laser system as claimed in claim 1, wherein said signal source comprises a fiber oscillator, and said at least one tap unit provides a small signal output for measurement of said oscillator spectrum.

5. The pulsed laser system as claimed in claim 1, further comprising: at least one isolator module between said signal source and said fiber amplifier for providing at least 35 dB isolation therebetween.

6. The pulsed laser system as claimed in claim 1, wherein said at least one tap unit provides a small signal output representative of pump power from a pump diode source, said small signal output providing an input for a feedback loop to regulate the pump diode source.

7. A pulsed laser system, comprising:

a signal source;

a stretcher temporally stretching an output of said source;

a fiber amplifier;

a compressor recompressing an output of said amplifier;

an AOM selecting output pulses from said amplifier; wherein each of said signal source, said stretcher, said fiber amplifier, said AOM and said compressor comprise a pre-tested module, and said system is configured with at least said signal source, said stretcher, said fiber amplifier and said AOM optically connected via fiber splices;

at least one tap unit within or between ones of said modules, including means for picking off a portion of said signal, wherein said at least one tap unit provides a small signal output to a diagnostic means, said signal output being provided during manufacturing or service of said pulsed laser system;

at least one spectral filter, said at least one spectral filter being disposed external to said signal source and said fiber amplifier, and either before or after said stretcher, said filter having a wavelength sensitive characteristic that modifies a spectral shape of an output from said signal source and narrows the spectrum of the signal source output, wherein at least one of said tap units is located downstream of said filter and configured to enable measurement of said narrowed spectrum, and wherein said filter is disposed before said stretcher, and an attenuator module disposed between said signal source and said stretcher, said attenuator controlling an amplitude of a pulse emitted from said source so as to prevent non-linear effects within said stretcher from altering the pulse spectrum.

8. The pulsed laser system as claimed in claim 7, wherein said small signal output is representative of a signal spectrum within or between said modules.

9. The pulsed laser system as claimed in claim 7, wherein said at least one tap unit provides a small signal output representative of pump power from a pump diode source, said small signal output providing an input for a feedback loop to regulate the pump diode source.

* * * * *